US011171201B2

(12) United States Patent
Yamaji

(10) Patent No.: US 11,171,201 B2
(45) Date of Patent: Nov. 9, 2021

(54) SEMICONDUCTOR INTEGRATED CIRCUIT HAVING A FIRST BURIED LAYER AND A SECOND BURIED LAYER

(71) Applicant: FUJI ELECTRIC CO., LTD., Kawasaki (JP)

(72) Inventor: Masaharu Yamaji, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/580,661

(22) Filed: Sep. 24, 2019

(65) Prior Publication Data

US 2020/0161418 A1 May 21, 2020

(30) Foreign Application Priority Data

Nov. 15, 2018 (JP) .............................. JP2018-214854

(51) Int. Cl.
| | |
|---|---|
| *H01L 29/06* | (2006.01) |
| *H01L 21/02* | (2006.01) |
| *H01L 21/266* | (2006.01) |
| *H01L 29/10* | (2006.01) |

(52) U.S. Cl.
CPC .... *H01L 29/0623* (2013.01); *H01L 21/02293* (2013.01); *H01L 21/266* (2013.01); *H01L 29/0646* (2013.01); *H01L 29/1095* (2013.01)

(58) Field of Classification Search
CPC ........... H01L 29/0623; H01L 29/66325; H01L 29/7393; H01L 29/1095; H01L 29/0646; H01L 21/02293; H01L 21/266; H01L 21/82392; H01L 21/823892

USPC ......................................................... 257/349
See application file for complete search history.

(56) References Cited

U.S. PATENT DOCUMENTS

| | | | | |
|---|---|---|---|---|
| 9,052,345 | B2 * | 6/2015 | Lisart | ................. G01R 31/2856 |
| 9,484,454 | B2 * | 11/2016 | Levy | ............... H01L 21/823462 |
| 9,553,142 | B2 | 1/2017 | Chang et al. | |
| 10,002,961 | B2 * | 6/2018 | Yamaji | ................. H01L 27/0727 |
| 2004/0155257 | A1 * | 8/2004 | Yashita | ............... H01L 29/1087 257/107 |
| 2004/0213072 | A1 * | 10/2004 | Pidutti | ............. H03K 17/04106 365/232 |

(Continued)

FOREIGN PATENT DOCUMENTS

| | | |
|---|---|---|
| JP | 2015-201500 A | 11/2015 |
| JP | 2016-42558 A | 3/2016 |

(Continued)

*Primary Examiner* — Khiem D Nguyen

(57) ABSTRACT

A semiconductor integrated circuit includes: a semiconductor base body of a first conductivity type; a first well region of a second conductivity type, deposited at an upper portion of the semiconductor base body, to which a first potential is applied; a second well region of the first conductivity type, deposited at an upper portion of the first well region, to which a second potential lower than the first potential is applied; a main electrode region to which the second potential is applied, the main electrode region being deposited at the upper portion of the first well region and away from the second well region; a first buried layer of the second conductivity type buried locally under the second well region; and a second buried layer of the second conductivity type buried locally under the main electrode region and away from the first buried layer.

20 Claims, 17 Drawing Sheets

(56) References Cited

U.S. PATENT DOCUMENTS

| | | | |
|---|---|---|---|
| 2009/0294865 A1 | 12/2009 | Tang et al. | |
| 2012/0018804 A1* | 1/2012 | Khemka | H01L 29/7816 257/337 |
| 2014/0210002 A1* | 7/2014 | Sawase | H01L 29/0865 257/334 |
| 2015/0041894 A1* | 2/2015 | Hebert | H01L 29/0634 257/339 |
| 2015/0236013 A1* | 8/2015 | Yamaji | H03K 19/018571 257/296 |
| 2015/0287719 A1* | 10/2015 | Furuhata | H01L 29/36 257/337 |
| 2016/0035885 A1 | 2/2016 | Sawase et al. | |
| 2016/0056148 A1* | 2/2016 | Kanno | H01L 29/7395 257/139 |
| 2016/0071837 A1* | 3/2016 | Lee | H01L 29/8611 257/272 |

FOREIGN PATENT DOCUMENTS

| | | |
|---|---|---|
| JP | 2017-11311 A | 1/2017 |
| JP | 6120586 B2 | 4/2017 |
| JP | 2017-168478 A | 9/2017 |

\* cited by examiner

SEMICONDUCTOR INTEGRATED CIRCUIT HAVING A FIRST BURIED LAYER AND A SECOND BURIED LAYER

CROSS-REFERENCE TO RELATED APPLICATION

This application claims benefit of priority under 35 USC 119 based on Japanese Patent Application No. 2018-214854 filed on Nov. 15, 2018, the entire contents of which are incorporated by reference herein.

BACKGROUND

1. Field of the Invention

The present invention relates to semiconductor integrated circuits, and more particularly, to a power semiconductor integrated circuit.

2. Description of the Related Art

Low capacity inverters mainly use a high voltage integrated circuit (HVIC) for driving and controlling power switching elements implementing a bridge circuit for power conversion, for example. Such a HVIC transmits a drive signal through an output terminal to the respective power switching elements for turning on/off the gates so as to drive the respective power switching elements in accordance with an input signal from an input terminal. The bridge circuit for power conversion converts power when a power switching element on a high voltage side (hereinafter referred to as a "high-voltage-side switching element") and a power switching element on a low voltage side (hereinafter referred to as a "low-voltage-side switching element") each receive the drive signal from the HVIC and start operating.

The HVIC converts an input signal based on a GND potential to a signal based on a VS potential higher than the GND potential so as to output the converted signal. This function enables the gate driving in the respective low-voltage-side and high-voltage-side switching elements. The HVIC includes a low side circuit region operating with the GND potential as a reference potential, and a high side circuit region operating with the VS potential as a reference potential and with a VB potential as a power supply potential higher than the VS potential.

The high side circuit region includes a deep diffusion layer of n-type (n-well region) deposited at an upper portion of a substrate of p-type, and a diffusion layer of p-type (p-well region) deposited at an upper portion of the n-well region. When the HVIC is in operation, the VB potential is applied to the n-well region, and the VS potential is applied to the p-well region. Since the VB potential is higher than the VS potential in a normal operation, a vertical parasitic pnp bipolar transistor implemented by the p-well region, the n-well region, and the p-type substrate does not activate. However, the parasitic pnp bipolar transistor turns on when the VB potential is led to a negative voltage lower than the VS potential (a voltage of a minus potential) because of noise such as a lightning surge, causing a large current to flow from the p-well region to the p-type substrate.

To inhibit the activation of the parasitic pnp bipolar transistor, a buried layer of n-type having a high concentration can be buried at the interface between the n-well region and the p-type substrate in the high side circuit region. This can decrease a DC current amplification factor $h_{FE}$ of the parasitic pnp bipolar transistor to a low level, so as to prevent damage to the HVIC. However, a capacitance at the junction between the n-type buried layer and the p-type substrate increases when the n-type buried layer having a high concentration is buried in the high side circuit region evenly along the interface between the n-well region and the p-type substrate, as compared with a capacitance at the junction between the n-well region and the p-type substrate in the high side circuit region without the n-type buried layer provided. The increased junction capacitance leads to an increase in displacement current when a dV/dt surge is input to the VS potential, which tends to cause a malfunction in the HVIC. In order to ensure the tolerance for the malfunction derived from the dV/dt noise, a distance between the low side circuit region and the high side circuit region needs to be increased to prevent the flow of the displacement current, for example, which inevitably increases the chip area.

JP 2016-042558 discloses a structure in which a buried layer of n-type is buried evenly at a position in an n-well region in a high side circuit region. U.S. Pat. No. 9,553,142B2 discloses a structure in which a plurality of buried layers of n-type are buried at bottoms of an n-well region and a p-well region. US 2009/0294865A1 discloses a structure in which a buried layer of n-type is buried evenly under a p-well region and an n-well region. JP 2015-201500A discloses a structure in which a buried layer of n-type is buried evenly along a plurality of well regions. JP 2017-11311A1 discloses a structure in which a buried layer of n-type is buried evenly in an element-forming region surrounded by a trench isolation structure. JP 2017-168478A discloses a structure in which a buried layer of n-type is buried evenly in an element region surrounded by a diffusion layer of n-type. JP 6120586B discloses a structure in which a buried layer of n-type is buried evenly at a bottom of an n-well region isolated by a trench isolation structure.

SUMMARY

In view of the foregoing problems, the present invention provides a semiconductor integrated circuit as a HVIC having a high noise tolerance without an increase in chip area.

An aspect of the present invention inheres in a semiconductor integrated circuit, encompassing: a semiconductor base body of a first conductivity type; a first well region of a second conductivity type, deposited at an upper portion of the semiconductor base body, to which a first potential is applied; a second well region of the first conductivity type, deposited at an upper portion of the first well region, to which a second potential lower than the first potential is applied; a main electrode region to which the second potential is applied, the main electrode region being deposited at the upper portion of the first well region and away from the second well region; a first buried layer of the second conductivity type buried locally under the second well region; and a second buried layer of the second conductivity type buried locally under the main electrode region and away from the first buried layer.

DETAILED DESCRIPTION

Figure 1:
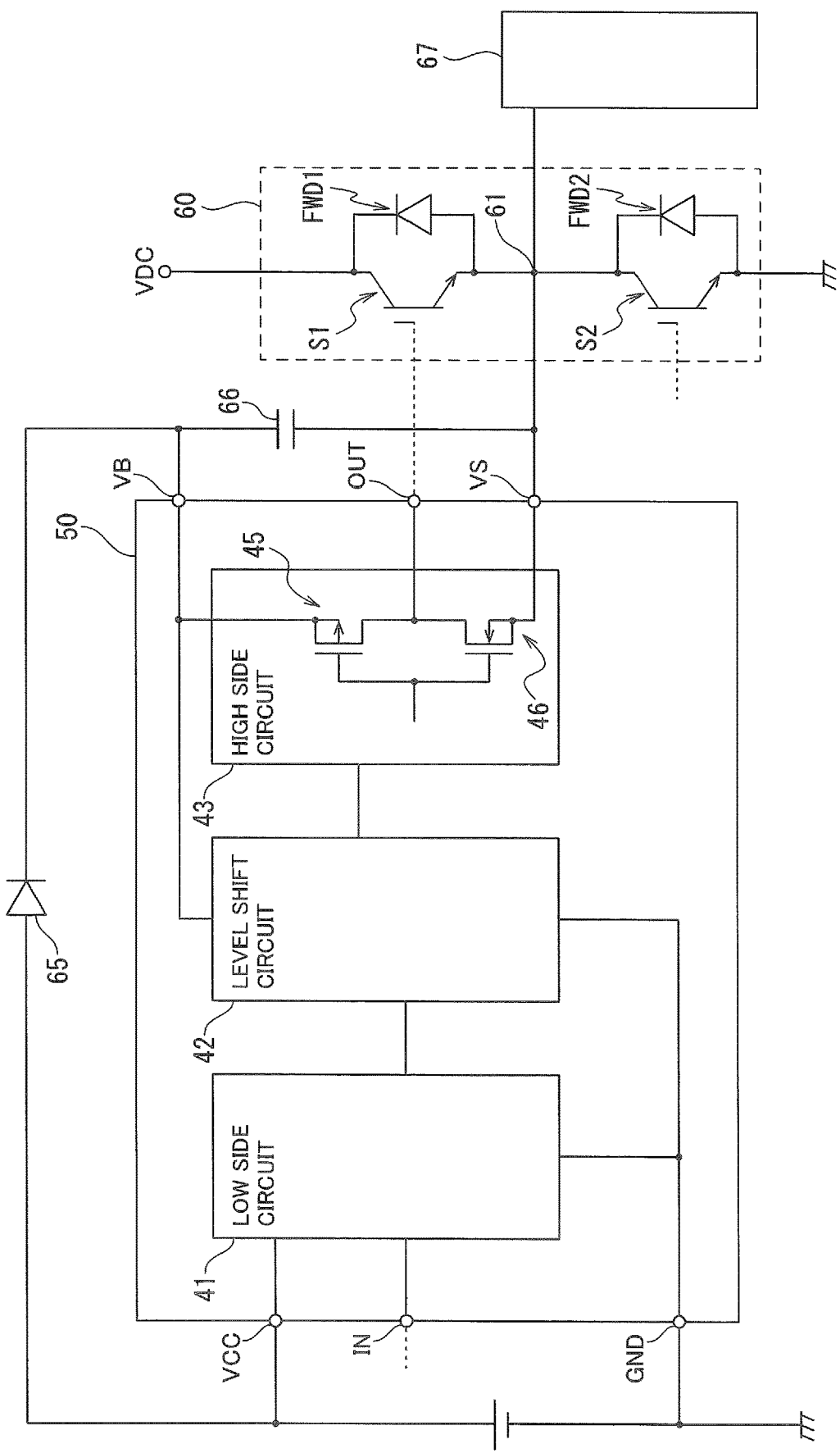
FIG. 1 is a circuit diagram illustrating a semiconductor integrated circuit according to an embodiment of the present invention.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiments described below merely illustrate schematically devices and methods for specifying and giving shapes to the technical idea of the present invention, and the span of the technical idea is not limited to materials, shapes, structures, and relative positions of elements described herein.

In the Specification, a "first main electrode region" is assigned to a semiconductor region which will be a source region or a drain region in a field-effect transistor (FET) or a static induction transistor (SIT), an emitter region or a collector region in an insulated-gate bipolar transistor (IGBT) and an anode region or a cathode region in a static induction (SI) thyristor or a gate turn-off (GTO) thyristor. A "second main electrode region" is assigned to a semiconductor region which will not be the first main electrode region and will be the source region or the drain region in the FET or the SIT, the emitter region or the collector region in the IGBT, and the anode region or the cathode region in the SI thyristor or the GTO thyristor. That is, when the first main electrode region is the source region, the second main electrode region means the drain region. When the first main electrode region is the emitter region, the second main electrode region means the collector region. When the first main electrode region is the anode region, the second main electrode region means the cathode region. In some appropriate cases, a function of the first main electrode region and a function of the second main electrode region are exchangeable each other by exchanging a bias relationship if the structure of the subject semiconductor device is symmetric. Furthermore, a "main electrode region" is described in the Specification, the main electrode region comprehensively means any one of the first main electrode region and the second main electrode region.

In the Specification, description is made in the following manner. That is, as a "high potential electrode terminal", a drain terminal is selected in a MISFET and a MISSIT, and a collector terminal is selected in IGBT. In this case, as a "low potential electrode terminal", a source terminal is selected in the MISFET and the MISSIT, and an emitter terminal is selected in the IGBT. Further, in the MISFET, the MISSIT, and the IGBT, a "control terminal" corresponds to a gate terminal.

Further, definitions of directions such as an up-and down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity type is a p-type and a second conductivity type is an n-type. However, the relationship of the conductivity types may be inverted to set the first conductivity type to the n-type and the second conductivity type to the p-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration. Moreover, it is technically and logically obvious that the members and the regions that are limited by adding "first conductivity type" and "second conductivity type" in the following description indicate the members and the regions formed of semiconductor materials without particular obvious limitations.

<Structure of Semiconductor Integrated Circuit>

A semiconductor integrated circuit 50 according to the embodiment of the present invention is a high voltage integrated circuit (HVIC) for driving a power converter 60 as a target to be driven, for example, which is a single phase of a bridge circuit for power conversion as illustrated in FIG. 1. The power converter 60 includes a high-voltage-side switching element S1 and a low-voltage-side switching element S2 connected in series to implement an output circuit.

While FIG. 1 illustrates a case in which the high-voltage-side switching element S1 and the low-voltage-side switching element S2 are each an IGBT, the high-voltage-side switching element S1 and the low-voltage-side switching element S2 are not limited to the IGBT, and may be any other power switching element such as a MOSFET. FIG. 1 illustrates an equivalent circuit in which a freewheeling diode FWD1 is connected antiparallel to the high-voltage-side switching element S1, and a freewheeling diode FWD2 is connected antiparallel to the low-voltage-side switching element S2. The present embodiment can actually use a reverse conducting IGBT (RC-IGBT) in which the high-voltage-side switching element S1 and the freewheeling diode FWD1 are integrated in a single chip, and the low-voltage-side switching element S2 and the freewheeling diode FWD2 are integrated into a single chip.

The high-voltage-side switching element S1 and the low-voltage-side switching element S2 are connected in series between a high-voltage main power supply VDC on the positive electrode side and a ground potential (GND potential) on the negative electrode side counter to the main power supply VDC to implement a half-bridge circuit. A high potential electrode terminal (collector terminal) of the high-voltage-side switching element S1 is connected to the main power supply VDC, and a low potential electrode terminal (emitter terminal) of the low-voltage-side switching element S2 is connected to the GND potential. A connection point 61 between a low potential electrode terminal (emitter terminal) of the high-voltage-side switching element S1 and a high potential electrode terminal (collector terminal) of the low-voltage-side switching element S2 is an output point of the power converter 60 serving as a single phase of the bridge circuit for power conversion. A load 67 such as a motor is connected to the connection point 61 so that a VS potential at a reference voltage terminal VS is supplied to the load 67.

The semiconductor integrated circuit 50 according to the embodiment of the present invention transmits a drive signal through an output terminal OUT to the high-voltage-side switching element S1 for turning on/off its gate so as to drive the high-voltage-side switching element S1 in accordance with an input signal from an input terminal IN. The semiconductor integrated circuit 50 according to the embodiment of the present invention includes at least a low-potential-side circuit (low side circuit) 41, a level shift circuit 42, and a high-potential-side circuit (high side circuit) 43 as part of elements. The low side circuit 41, the level shift circuit 42, and the high side circuit 43 may be integrated in a single semiconductor chip (semiconductor substrate) in a monolithic manner, for example. Alternatively, elements implementing the low side circuit 41, the level shift circuit 42, and the high side circuit 43 may be separately integrated into two or more semiconductor chips.

The low side circuit 41 operates with a GND potential as a reference potential applied to a ground terminal GND and with a VCC potential as a power supply potential applied to a low-potential-side power supply terminal VCC. The low side circuit 41 generates an on/off signal at a low-side level in response to the input signal from the input terminal IN, and transmits the on/off signal to the level shift circuit 42. Although not shown, the low side circuit 41 may include a complementary MOS (CMOS) circuit including an nMOS transistor and a pMOS transistor.

The level shift circuit 42 operates with the GND potential as a reference potential applied to the ground terminal GND. The level shift circuit 42 converts the on/off signal from the low side circuit 41 into an on/off signal at a high-side level used on the high side. Although not shown, the level shift circuit 42 may include an nMOS transistor, a level sift resistance, and a protection diode to serve as a level shifter.

The high side circuit 43 operates with the VS potential as a reference potential applied to the reference voltage terminal VS and with a VB potential, which is a first potential, as a power supply potential applied to a high-potential-side power supply terminal VB. The high side circuit 43 transmits the drive signal through the output terminal OUT in accordance with the on/off signal from the level shift circuit 42, so as to drive the gate of the high-voltage-side switching element S1. The high side circuit 43 includes a CMOS circuit including, in the output stage, an nMOS transistor 46 as an active element and a pMOS transistor 45 as an active element, for example. A source terminal of the pMOS transistor 45 is connected to the high-potential-side power supply terminal VB. A source terminal of the nMOS transistor 46 is connected to the reference voltage terminal VS. The output terminal OUT is connected between a drain terminal of the pMOS transistor 45 and a drain terminal of the nMOS transistor 46.

The semiconductor integrated circuit 50 according to the embodiment of the present invention is illustrated with a bootstrap circuit system. FIG. 1 illustrates a case in which a bootstrap diode 65 serving as an external element is connected between the low-potential-side power supply terminal VCC and the high-potential-side power supply terminal VB. A bootstrap capacitor 66 serving as an external element is connected between the high-potential-side power supply terminal VB and the reference voltage terminal VS. The bootstrap diode 65 and the bootstrap capacitor 66 partly implement a circuit of a drive power supply of the high-voltage-side switching element S1.

The VB potential is the highest potential applied to the semiconductor integrated circuit 50, and is kept at a higher level by 15 voltages than the VS potential, which is a second potential, by the bootstrap capacitor 66 in a normal state without being influenced by noise. The VS potential is repeatedly boosted and dropped between the potential on the high potential side (for example, about 400 to 600 voltages) and the potential on the low potential side (the GND potential) to fluctuate between zero and several hundred voltages, or may reach a minus potential, when the high-voltage-side switching element S1 and the low-voltage-side switching element S2 are complementarily turned on/off.

Figure 2:
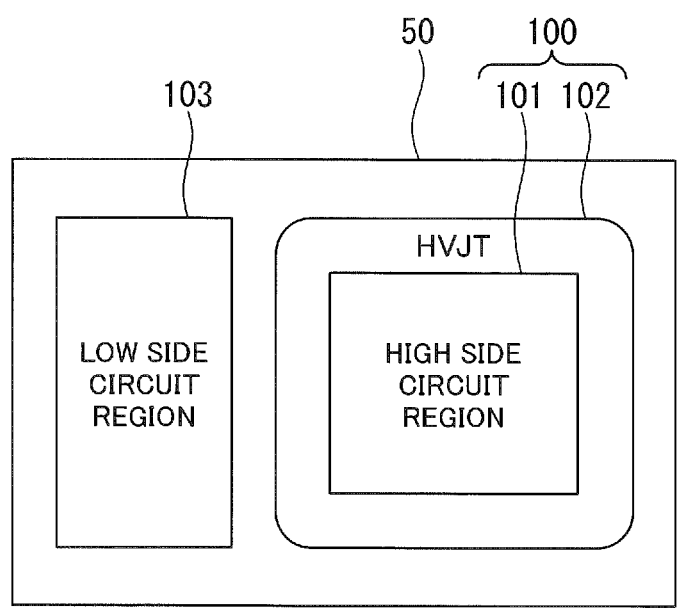
FIG. 2 is a plan view illustrating the semiconductor integrated circuit according to the embodiment of the present invention.

FIG. 2 is a plan view illustrating a schematic layout of the semiconductor integrated circuit 50 according to the embodiment of the present invention. The semiconductor integrated circuit 50 according to the embodiment of the present invention includes a high-potential-side circuit portion (high side circuit portion) 100 and a low-potential-side circuit region (low side circuit region) 103 integrated in a single chip. The high side circuit portion 100 includes a high-potential-side circuit region (high side circuit region) 101, and a high voltage junction termination structure (HVJT) 102 arranged at a circumference of the high side circuit region 101.

The high side circuit region 101 corresponds to the high side circuit 43 illustrated in FIG. 1. The HVJT 102 electrically isolates the high side circuit region 101 from the low side circuit region 103. The HVJT 102 includes a circuit region corresponding to the level shift circuit 42 illustrated in FIG. 1. The low side circuit region 103 corresponds to the low side circuit 41 illustrated in FIG. 1.

Figure 3:
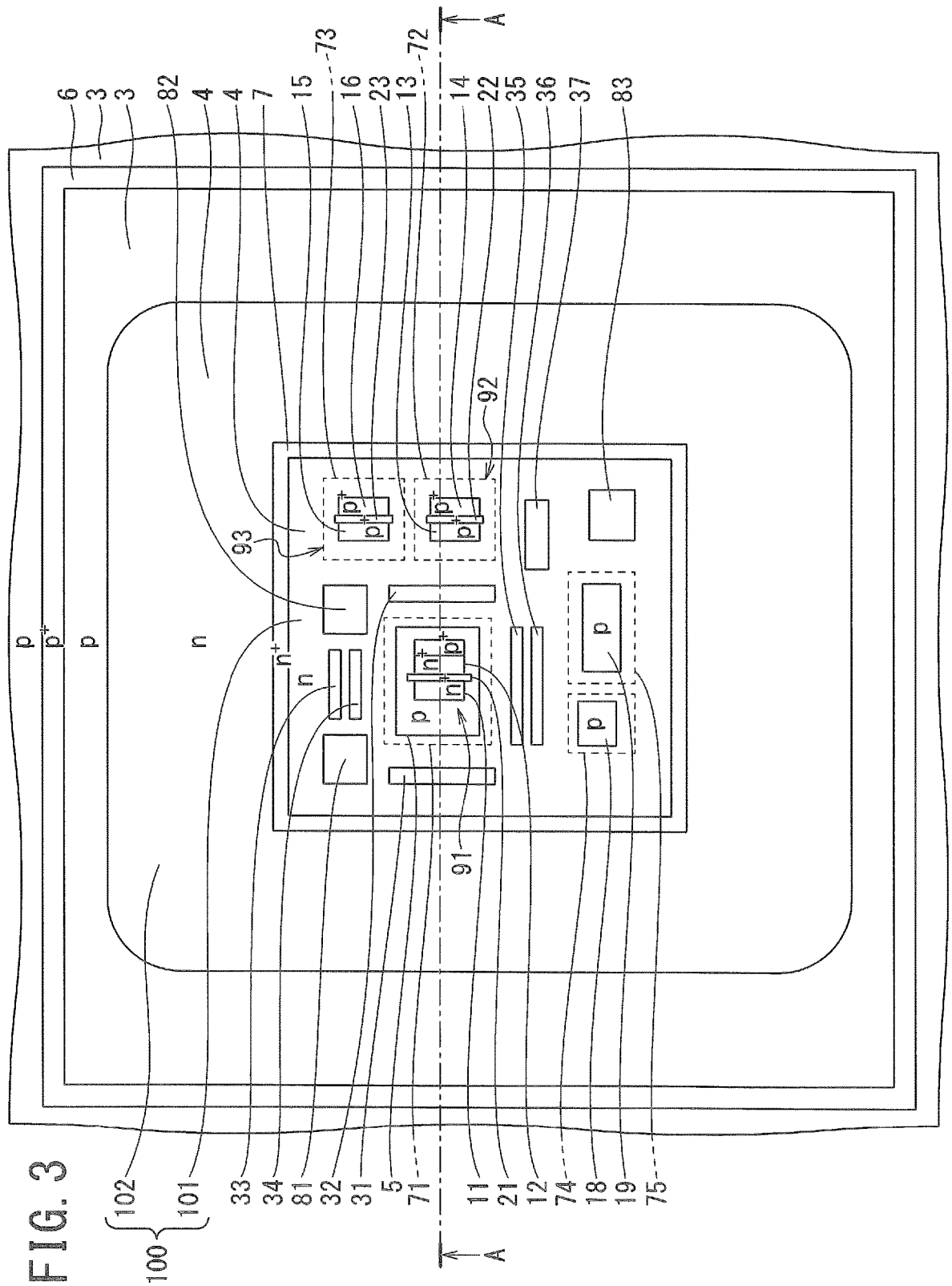
FIG. 3 is a plan view illustrating a high side circuit region including its circumferential area in the semiconductor integrated circuit according to the embodiment of the present invention.
Figure 4:
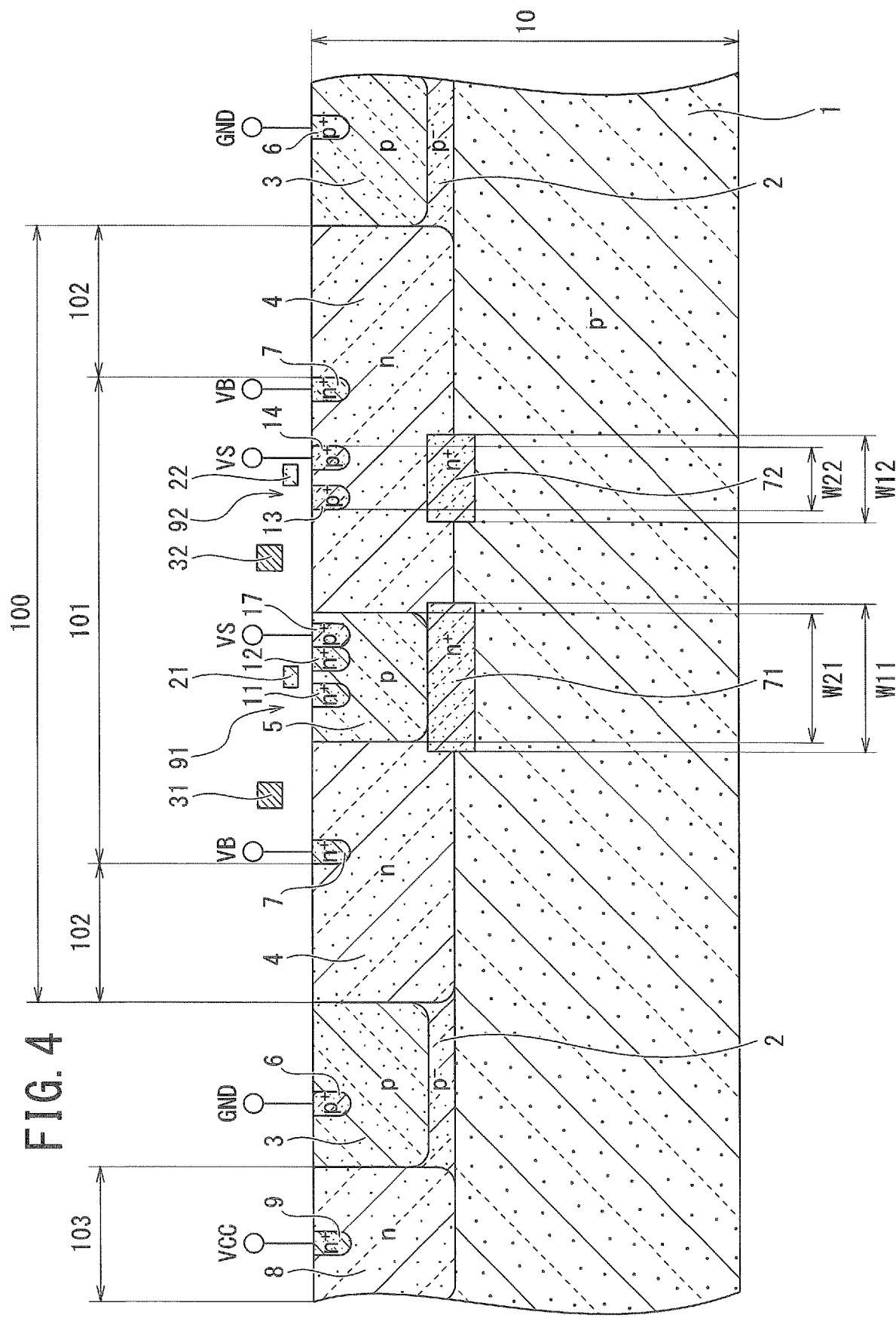
FIG. 4 is a cross-sectional view of the semiconductor integrated circuit as viewed from direction A-A in FIG. 3.

FIG. 3 is a plan view illustrating a specific layout of the high side circuit portion 100 including its circumferential area illustrated in FIG. 2. FIG. 4 is a cross-sectional view of the high side circuit portion 100 as viewed from direction A-A in FIG. 3, partly including the low side circuit region 103 adjacent to the high side circuit portion 100. As illustrated in FIG. 4, the high side circuit portion 100 is deposited at an upper portion of a semiconductor base body 10 of a first conductivity type (p$^-$-type). The semiconductor base body 10 includes a semiconductor substrate 1 of the first conductivity type (p$^-$-type) made from silicon (Si), and an epitaxial layer 2 of the first conductivity type (p$^-$-type) deposited on the semiconductor substrate 1. The semiconductor substrate 1 is connected to the GND potential.

As illustrated in FIG. 3 and FIG. 4, a well region (n-well region) 4 of a second conductivity type (n-type) is selectively deposited in the epitaxial layer 2 in the high side circuit portion 100 so as to penetrate the epitaxial layer 2. A depth of the n-well region 4 is about 10 micrometers, for example. A contact region 7 of the second conductivity type (n$^+$-type) is selectively deposited at an upper portion of the n-well region 4. The contact region 7 is connected to the high-potential-side power supply terminal VB.

As illustrated in FIG. 3, the contact region 7 has a loop-shaped (frame-like) planar pattern. In the high side circuit portion 100, the high side circuit region 101 is enclosed in a region surrounded by the contact region 7, and the HVJT 102 is arranged on the outside of the region surrounded by the contact region 7. Although not shown, the HVJT 102 may include the level shift circuit 42 illustrated in FIG. 1. An isolation region 3 of the first conductivity type (p-type) is delineated into a loop shape (frame-like shape) on the outside of the n-well region 4 implementing the HVJT 102. A contact region 6 of the first conductivity (p$^+$-type) is deposited at an upper portion of the isolation region 3. The contact region 6 is connected to the ground terminal GND.

As illustrated in FIG. 3 and FIG. 4, a well region (p-well region) 5 of the first conductivity type (p-type) is selectively deposited at the upper portion of the n-well region 4 in the high side circuit region 101. A contact region 17 of p$^+$-type is selectively deposited at an upper portion of the p-well region 5. The contact region 17 is connected to the reference voltage terminal VS. An intermediate voltage nMOS transistor 91 is implemented by the upper portion of the p-well region 5. The p-well region 5 serves as a back gate layer of the nMOS transistor 91.

The nMOS transistor 91 includes a first main electrode region (source region) 11 of n$^+$-type selectively deposited at the upper portion of the p-well region 5, and a second main electrode region (drain region) 12 of n$^+$-type selectively deposited at the upper portion of the p-well region 5 and opposed to the source region 11 with a gap interposed which is a part of the p-well region 5. The source region 11 and the drain region 12 have a higher impurity concentration than the n-well region 4.

The nMOS transistor 91 further includes a gate electrode 21 arranged across the drain region 12 and the source region 11 via a gate insulating film (not shown). The gate insulating film may be a silicon oxide film (SiO$_2$ film) or various types of insulating film such as a silicon nitride film (Si$_3$N$_4$ film) other than the SiO$_2$ film, or may be a stacked film of insulating films including the SiO$_2$ film and the Si$_2$N$_4$ film. The gate electrode 21 is made from a polycrystalline silicon (doped polysilicon) film to which impurity ions are doped, refractory metal, or refractory metal silicide, for example.

An intermediate voltage pMOS transistor 92 is implemented by the upper portion of the n-well region 4 away from the p-well region 5 in the high side circuit region 101. The pMOS transistor 92 includes a first main electrode region (source region) 13 of p$^+$-type selectively deposited at the upper portion of the n-well region 4, and a second main electrode region (drain region) 14 of p$^+$-type selectively deposited at the upper portion of the n-well region 4 and opposed to the source region 13 with a gap interposed which is a part of the n-well region 4. The source region 13 and the drain region 14 have a higher impurity concentration than the p-well region 5. The drain region 14 is connected to the reference voltage terminal VS. The pMOS transistor 92 further includes a gate electrode 22 arranged across the drain region 14 and the source region 13 via a gate insulating film (not shown).

As illustrated in FIG. 3 and FIG. 4, a buried layer 71 of n$^+$-type having a higher impurity concentration than the n-well region 4 is buried locally and limitedly under the p-well region 5 electrically connected to the reference voltage terminal VS. The buried layer 71 is located at the interface between the semiconductor substrate 1 and the n-well region 4. While FIG. 4 illustrates a case in which a width W11 of the buried layer 71 is greater than a width W21 of the p-well region 5 so that the buried layer 71 laterally expands on both sides of the p-well region 5, the with W11 of the buried layer 71 may be equal to the width W21 of the p-well region 5.

As illustrated in FIG. 3, the p-well region 5 and the buried layer 71 are arranged such that the respective planar patterns overlap with each other. While FIG. 3 illustrates the case in which the p-well region 5 is enclosed in the buried layer 71 in the planar pattern, the p-well region 5 and the buried layer 71 may have the same planar pattern conforming to each other.

A buried layer 72 of n$^+$-type having a higher impurity concentration than the n-well region 4 is buried locally and limitedly under the pMOS transistor 92 away from the buried layer 71. The buried layer 72 is located at the interface between the semiconductor substrate 1 and the n-well region 4. A width W12 of the buried layer 72 is greater than a combined width W22 of the source region 13 and the drain region 14 of the pMOS transistor 92.

As illustrated in FIG. 3, the planar pattern of the combination of the source region 13 and the drain region 14 in the pMOS transistor 92 overlaps with the planar pattern of the buried layer 72. While FIG. 3 illustrates the case in which the source region 13 and the drain region 14 are both enclosed in the buried layer 72 in the planar pattern, the boundary of the combination of the source region 13 and the drain region 14 and the boundary of the buried layer 72 may have the same planar pattern conforming to each other. The buried layer 72 is only required to be located at least immediately under the drain region 14 of the pMOS transistor 92, and is not necessarily located immediately under the source region 13.

An intermediate voltage pMOS transistor 93 is further implemented in the high side circuit region 101 by the upper portion of the n-well region 4 away from the p-well region 5, as illustrated in FIG. 3. The pMOS transistor 93 includes a first main electrode region (source region) 15 of p$^+$-type selectively deposited at the upper portion of the n-well region 4, and a second main electrode region (drain region) 16 of p$^+$-type selectively deposited at the upper portion of the n-well region 4 and opposed to the source region 15 with a gap interposed which is a part of the n-well region 4. The drain region 16 is connected to the reference voltage terminal VS. The pMOS transistor 93 further includes a gate electrode 23 arranged across the drain region 16 and the source region 15 via a gate insulating film (not shown).

As illustrated in FIG. 3, a buried layer 73 of n$^+$-type having a higher impurity concentration than the n-well region 4 is buried locally and limitedly under the source region 15 and the drain region 16 of the pMOS transistor 93. Although not shown, the buried layer 73 is located at the interface between the semiconductor substrate 1 and the n-well region 4.

The planar pattern of the combination of the source region 15 and the drain region 16 in the pMOS transistor 93 overlaps with the planar pattern of the buried layer 73. While FIG. 3 illustrates the case in which the source region 15 and the drain region 16 are both enclosed in the buried layer 73 in the planar pattern, the boundary of the combination of the source region 15 and the drain region 16 and the boundary of the buried layer 73 may have the same planar pattern conforming to each other. The buried layer 73 is only required to be located at least immediately under the drain region 16 of the pMOS transistor 93, and is not necessarily located immediately under the source region 15.

As illustrated in FIG. 3, well regions (p-well regions) 18 and 19 of p-type are further deposited at the upper portion of the n-well region 4 in the high side circuit region 101. The p-well regions 18 and 19 are electrically connected to the reference voltage terminal VS, as in the case of the p-well region 5. Buried layers 74 and 75 of n$^+$-type having a higher impurity concentration than the n-well region 4 are buried locally and limitedly under the p-well regions 18 and 19, respectively. Although not shown, the buried layers 74 and 75 are located at the interface between the semiconductor substrate 1 and the n-well region 4.

While FIG. 3 illustrates the case in which the p-well regions 18 and 19 are respectively enclosed in the buried layers 74 and 75 in the planar pattern, the p-well regions 18 and 19 and the buried layers 74 and 75 may respectively have the same planar pattern conforming to each other.

As illustrated in FIG. 3 and FIG. 4, the high side circuit region 101 also includes passive elements 31, 32, 33, 34, 35, 36, and 37 provided over the semiconductor base body 10 via interlayer insulating films (not shown). The passive elements 31 to 37 are each any of a capacitor, a resistor, or a metal wire. The high side circuit region 101 further includes pads 81, 82, and 83 provided over the semiconductor base body 10 via interlayer insulating films (not shown). For example, the VB potential, the VS potential, or the VCC potential is applied to the pads 81 to 83. No buried layer of n$^+$-type, other than the n$^+$-type buried layers 71 to 75, is buried under the passive elements 31 to 37 or the pads 81 to 83.

As described above, the n$^+$-type buried layers 71 to 75 are buried locally and limitedly under the p-well regions 5, 18, and 19 and the p$^+$-type drain regions 14 and 16 electrically connected to the reference voltage terminal VS in the high side circuit region 101. The p-well regions 5, 18, and 19 and the p$^+$-type drain regions 14 and 16 are diffusion layers of p-type forming a vertical parasitic pnp bipolar transistor together with the p$^-$-type semiconductor substrate 1 and the n-well region 4 when the VB potential is led to a negative voltage lower than the VS potential due to noise such as a lightning surge. The buried layers 71 to 75 are buried at intervals at the same depth. The buried layers 71 to 75 are diffusion layers doped with n-type impurities such as antimonic (Sb), phosphorus (P), or arsenic (As).

The respective n$^+$-type buried layers are not necessarily buried under all of the p-type diffusion layers electrically connected to the reference voltage terminal VS in the high side circuit region 101. The respective n$^+$-type buried layers may be buried under some of the p-type diffusion layers electrically connected to the reference voltage terminal VS.

The configuration of the high side circuit region 101 illustrated in FIG. 3 and FIG. 4 is an example, and the species, the number, and the positional relationship of the elements included in the high side circuit region 101 are not limited to this illustration. For example, a diode including an anode region of p-type electrically connected to the reference voltage terminal VS may be provided in the high side circuit region 101. A buried layer of n$^+$-type may be buried locally and limitedly under the p-type anode region when the p-type anode region is located relatively deeply at a level of one fifth or greater of the depth of the n-well region 4, for example. When the p-type anode region is located relatively shallowly at a level of less than one fifth of the depth of the n-well region 4, any n$^+$-type buried layer is not necessarily buried under the p-type anode region.

As illustrated in FIG. 4, a well region (n-well region) 8 of n-type is provided in the low side circuit region 103 adjacent to the high side circuit portion 100 so as to penetrate the epitaxial layer 2. A contact region 9 of p$^+$-type is deposited at an upper portion of the n-well region 8. The contact region 9 is connected to the low-potential-side power supply terminal VCC.

First Comparative Example

Figure 5:
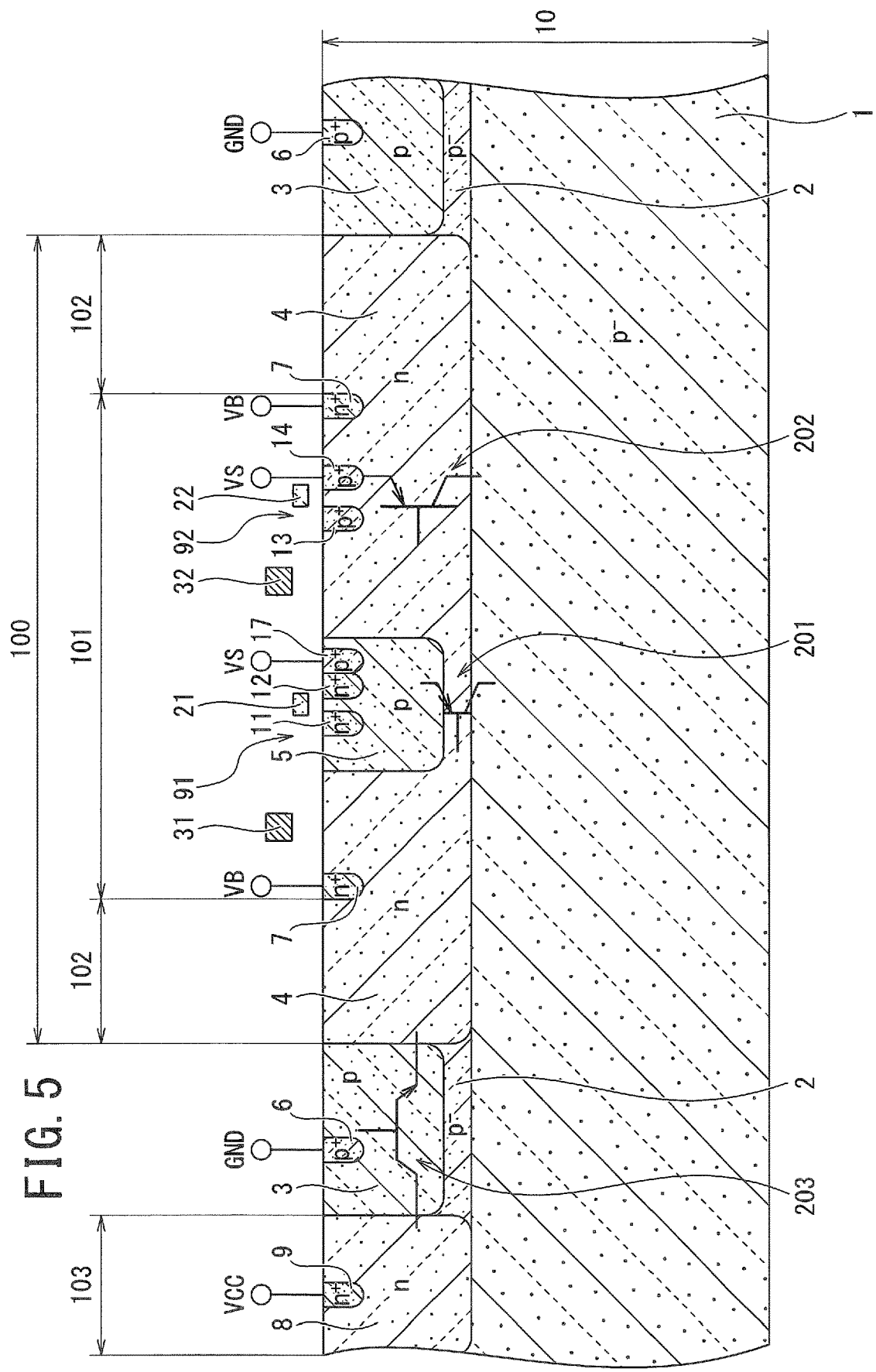
FIG. 5 is a circuit diagram illustrating a semiconductor integrated circuit of a first comparative example.

A semiconductor integrated circuit of a first comparative example is described below. As illustrated in FIG. 5, the semiconductor integrated circuit of the first comparative example differs from the semiconductor integrated circuit 50 according to the embodiment of the present invention illustrated in FIG. 4 in that no n$^+$-type buried layer is buried under the p-well region 5 or the pMOS transistor 92 in the high side circuit region 101.

The semiconductor integrated circuit of the first comparative example causes a parasitic pnp bipolar transistor 201 to be implemented by the p-well region 5, the n-well region 4, and the p$^-$-type semiconductor substrate 1 in the high side circuit region 101. A base terminal, an emitter terminal, and a collector terminal of the parasitic pnp bipolar transistor 201 are respectively connected to the high-potential-side power supply terminal VB, the reference voltage terminal VS, and the ground terminal GND.

The parasitic pnp bipolar transistor 201 does not activate in the semiconductor integrated circuit of the first comparative example in the normal operation in which the VB potential is higher than the VS potential. The parasitic pnp bipolar transistor 201 is turned on when the VB potential is decreased to be smaller than the VS potential by 0.6 voltages or greater which is a diffusion potential at a pn junction interface of silicon because of a surge, namely, when the VB potential and the VS potential are led to a potential relation: the VB potential<(the VS potential−0.6 [V]). The activation of the parasitic transistor or parasitic thyristor structurally formed in the high side circuit region 101 may cause a malfunction in the circuit or may cause local damage to the circuit. The surge current, if flowing into the low side circuit region 103, may cause a malfunction in or damage to the low side circuit region 103.

Second Comparative Example

Figure 6:
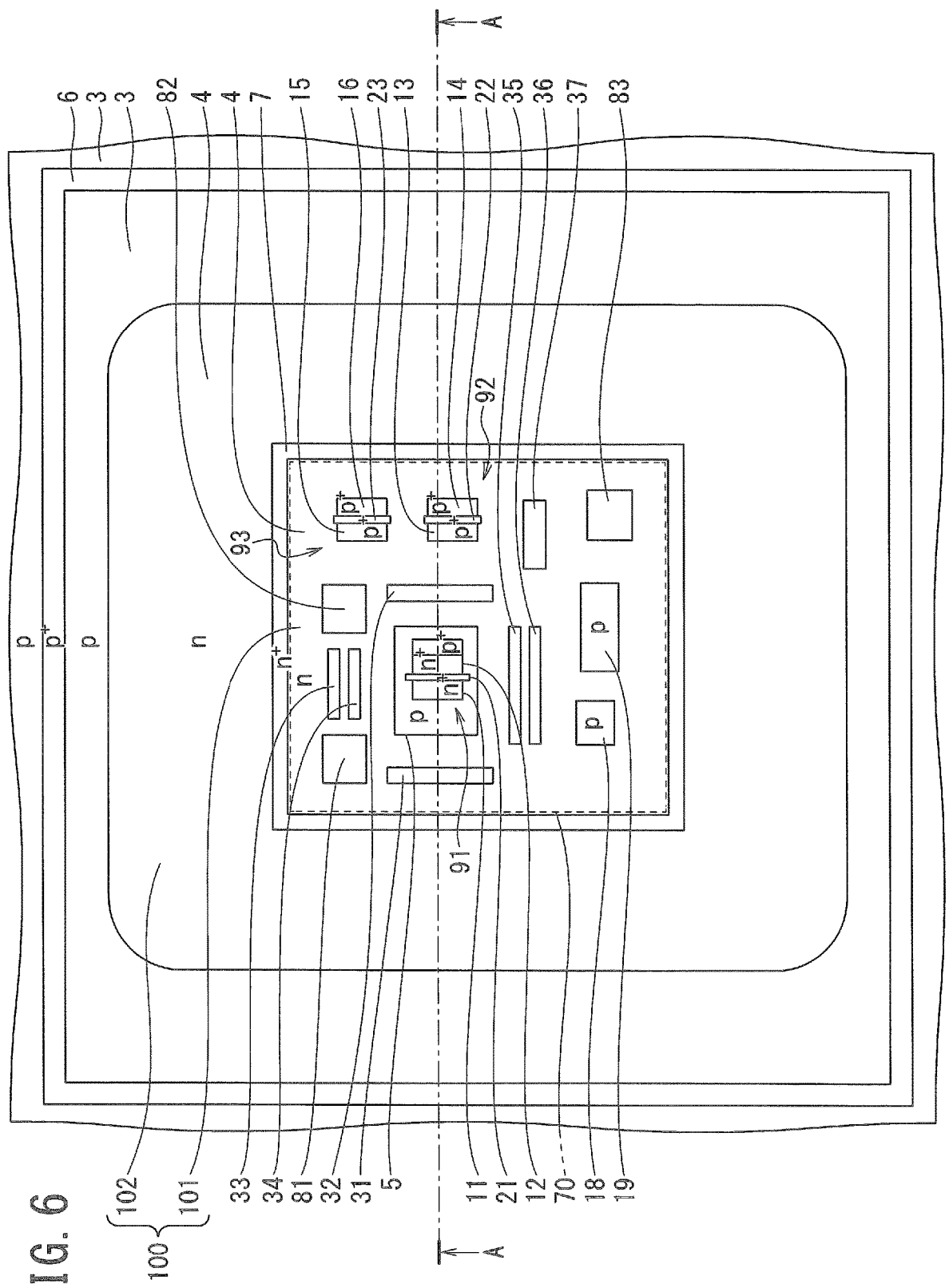
FIG. 6 is a plan view illustrating a high side circuit region including its circumferential area in a semiconductor integrated circuit of a second comparative example.
Figure 7:
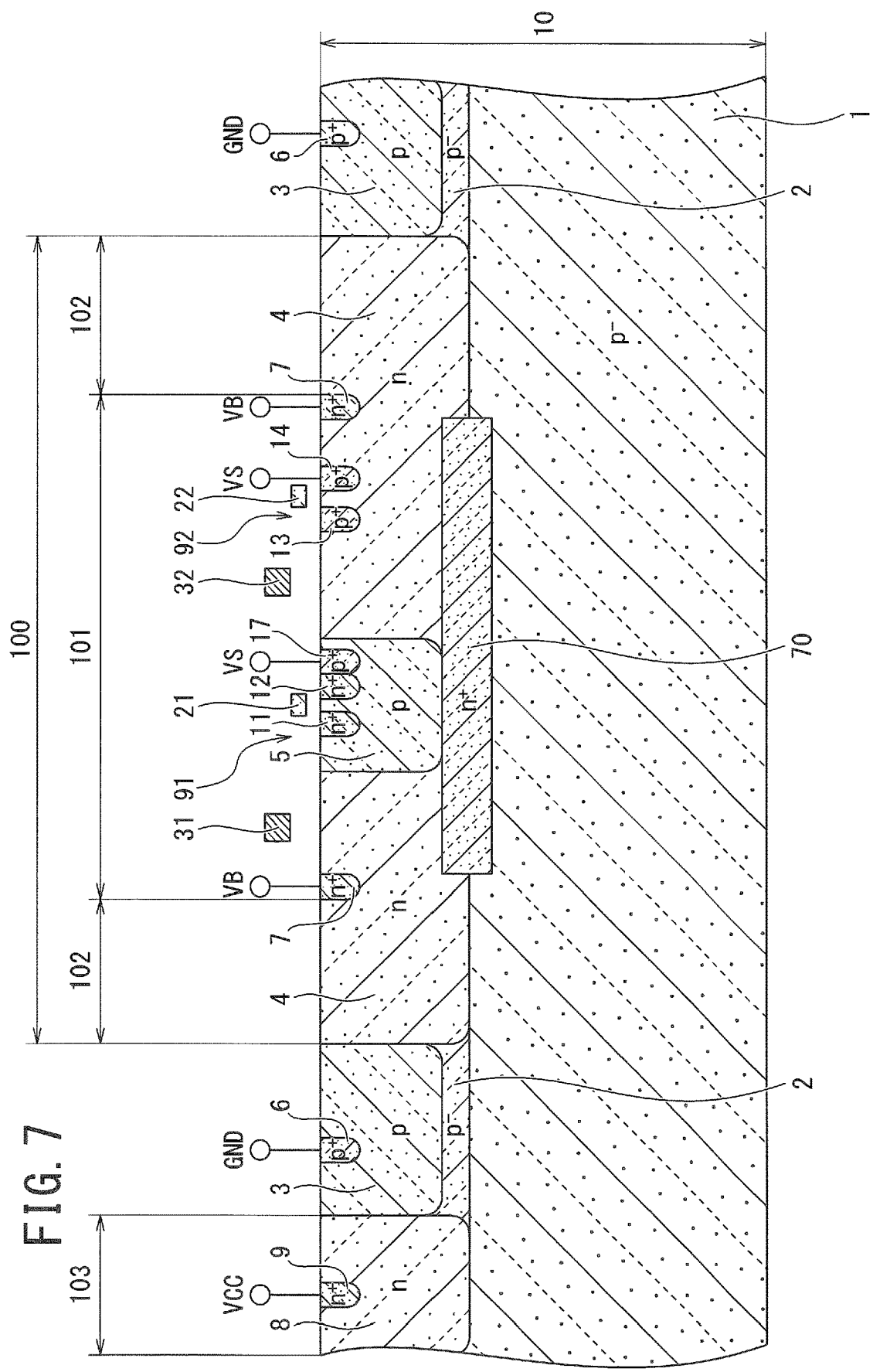
FIG. 7 is a cross-sectional view of the semiconductor integrated circuit as viewed from direction A-A in FIG. 6.

A semiconductor integrated circuit of a second comparative example is described below. As illustrated in FIG. 6 and FIG. 7, the semiconductor integrated circuit of the second comparative example differs from the semiconductor integrated circuit of the first comparative example in that a buried layer 70 of n+-type is buried evenly in the high side circuit region 101 so as to prevent the activation of the parasitic pnp bipolar transistor 201 caused in the semiconductor integrated circuit of the first comparative example illustrated in FIG. 5.

The buried layer 70 is buried at the interface between the p-type substrate 1 and the n-well region 5 in the high side circuit region 101. The buried layer 70 is buried only in the high side circuit region 101, since the buried layer 70, if expanding from the high side circuit region 101 into the HVJT 102, impedes depletion of the n-well region 4 to degrade the breakdown voltage properties. The buried layer 70 is buried in a blanket state evenly in the high side circuit region 101 so that a mask for forming the buried layer 70 can be used in various ways. Namely, the buried layer 70 is buried in the entire region included in the high side circuit region 101.

The semiconductor integrated circuit of the second comparative example including the buried layer 70 buried evenly and entirely in the high side circuit region 101, decreases, to one or smaller, a DC current amplification factor $h_{FE}$ of the parasitic pnp bipolar transistor implemented by the p-well region 5, the n+-type buried layer 70, and the p−-type semiconductor substrate 1. The activation of the parasitic pnp bipolar transistor thus can be avoided so as to prevent damage to the HVIC if the VB potential is led to a negative voltage lower than the VS potential.

However, the semiconductor integrated circuit of the second comparative example increases a parasitic capacity at the pn junction between the n+-type buried layer 70 and the p−-type semiconductor substrate 1 because of the arrangement of the buried layer 70 buried evenly and entirely in the high side circuit region 101, as compared with a parasitic capacity at the pn junction between the n-well region 4 and the p−-type semiconductor substrate 1 in the case of not including the buried layer 70. The junction capacity C at the pn junction is given by the following formula (1):

$$C = \frac{dQ}{dV} = \frac{\varepsilon_r \varepsilon_0}{W} = \left[\frac{q\varepsilon_r\varepsilon_0 N_A N_D}{2(N_A + N_D)} - \frac{1}{(V_D - V)}\right]^{\frac{1}{2}} \quad (1)$$

where Q is an electric charge per unit area, V is a bias potential, $\varepsilon_r$ is a relative permittivity of the semiconductor, $\varepsilon_0$ is a vacuum permittivity, W is a width of a depletion layer, $N_A$ is an acceptor concentration, $N_D$ is a donor concentration, and $V_D$ is a diffusion potential. According to the formula (1), the junction capacity C is proportional to the square root of the product of the donor concentration $N_D$ and the acceptor concentration $N_A$, and is inversely proportional to the square root of the sum of the donor concentration $N_D$ and the acceptor concentration $N_A$.

When the donor concentration $N_D$ around the pn junction between the n-well region 4 and the p−-type semiconductor substrate 1 is presumed to be about $5 \times 10^{14}$ cm$^{-3}$, the acceptor concentration $N_A$ of the p-type substrate is presumed to be about $1 \times 10^{14}$ cm$^{-3}$, and the donor concentration $N_D$ of the n+-type buried layer 70 is presumed to be about $5 \times 10^{17}$ cm$^{-3}$, the junction capacity C at the pn junction between the n+-type buried layer 70 and the p−-type semiconductor substrate 1 increases by about 9.5%. When the dV/dt surge is input to the VS potential in the HVIC, the total amount of the displacement current In at the parasitic capacity C×dV/dt thus increases by about 10%, which tends to cause a malfunction in the HVIC due to the displacement current flowing into the low side circuit region 103 or the high side circuit region 101. In order to ensure the tolerance for the malfunction derived from the dV/dt noise, a distance between the HVJT 102 and the high side circuit region 101 needs to be increased so as to prevent the flow of the displacement current, for example, which inevitably increases the chip area.

In contrast, the semiconductor integrated circuit 50 according to the embodiment of the present invention includes the n+-type buried layers 71 to 75 buried locally and limitedly under the p-well regions 5, 18, and 19 and the p+-type drain regions 14 and 16 electrically connected to the reference voltage terminal VS in the high side circuit region 101. The activation of the vertical parasitic pnp bipolar transistor implemented by the p−-type semiconductor substrate 1, the n+-type buried layers 71 to 75, the p-well regions 5, 18, and 19, and the p+-type drain regions 14 and 16, thus can be avoided if the VB potential is led to a negative voltage lower than the VS potential because of a lightning surge, for example, as in the case of the semiconductor integrated circuit of the second comparative example.

In the semiconductor integrated circuit 50 according to the embodiment of the present invention, no n+-type buried layer is buried at the interface between the p-type semiconductor substrate 1 and a region not provided with a logic device in the n-well region 4, since the vertical parasitic pnp bipolar transistor is not formed in the region not provided with the logic device in the n-well region 4. The semiconductor integrated circuit 50 according to the embodiment of the present invention thus can avoid an excessive increase in the junction capacity at the pn junction between the n-well region 4 and the p-type semiconductor substrate 1, so as to ensure the tolerance for a malfunction caused by dV/dt noise, as compared with the semiconductor integrated circuit of the second comparative example including the n+-type buried layer 70 buried evenly and entirely in the high side circuit region 101 illustrated in FIG. 6 and FIG. 7.

The proportion of the logic device occupying the high side circuit region 101 in the n-well region 4 is about 30% to 40%, while half or more of the high side circuit region 101 is occupied with the other elements such as the pads 81 to 83, the passive elements 31 to 35, and the wiring regions, although it depends on the rated output current of the semiconductor integrated circuit 50 according to the embodiment of the present invention or the specifications and the size of the level shift circuit 42, for example. The parasitic capacity at the junction between the n-well region 4 and the p-type semiconductor substrate 1 thus increases only by a small value of about 3%, instead of 9.5%. Since the increase in the displacement current amount at the parasitic capacity C×dV/dt is about 3% when the dV/dt noise is input to the reference voltage terminal VS, the increase in the chip area necessary for ensuring the tolerance for a malfunction upon the flow of the displacement current can be minimized, as compared with the case of the semiconductor integrated circuit of the second comparative example.

The semiconductor integrated circuit of the second comparative example as illustrated in FIG. 6 and FIG. 7 may also cause a lateral parasitic npn bipolar transistor to activate, in which the n-well region 4 serves as a collector, the p-type isolation region 3 serves as a base, and the n-well region 8 in the low side circuit region 103 serves as an emitter, which can cause damage to the HVIC because of thermal runaway if the VB potential in the high side circuit region 101 is led to a negative voltage lower than the VS potential, for example. Some measures may be taken to deal with the activation of the lateral parasitic npn bipolar transistor, such as an increase in distance between the high side circuit region 101 and the low side circuit region 103, interposition of a dielectric isolation layer between the high side circuit region 101 and the low side circuit region 103, and interposition of a p-type buried layer, but all of these measures increase the manufacturing costs.

In contrast, the semiconductor integrated circuit 50 according to the embodiment of the present invention including the buried layers 71 to 75 buried locally and limitedly, can increase the resistance on the collector side (on the n-well region 4 side) of the lateral parasitic npn bipolar transistor, as compared with the semiconductor integrated circuit of the second comparative example illustrated in FIG. 6 and FIG. 7 in which the $n^+$-type buried layer 70 is buried evenly and entirely in the high side circuit region 101. This can decrease the efficiency of flow of the collector current. The semiconductor integrated circuit 50 according to the embodiment of the present invention thus can further enhance the noise tolerance between the high side circuit region 101 and the low side circuit region 103 at low cost without an increase in chip area.

<Method of Manufacturing Semiconductor Integrated Circuit>

Figure 8:
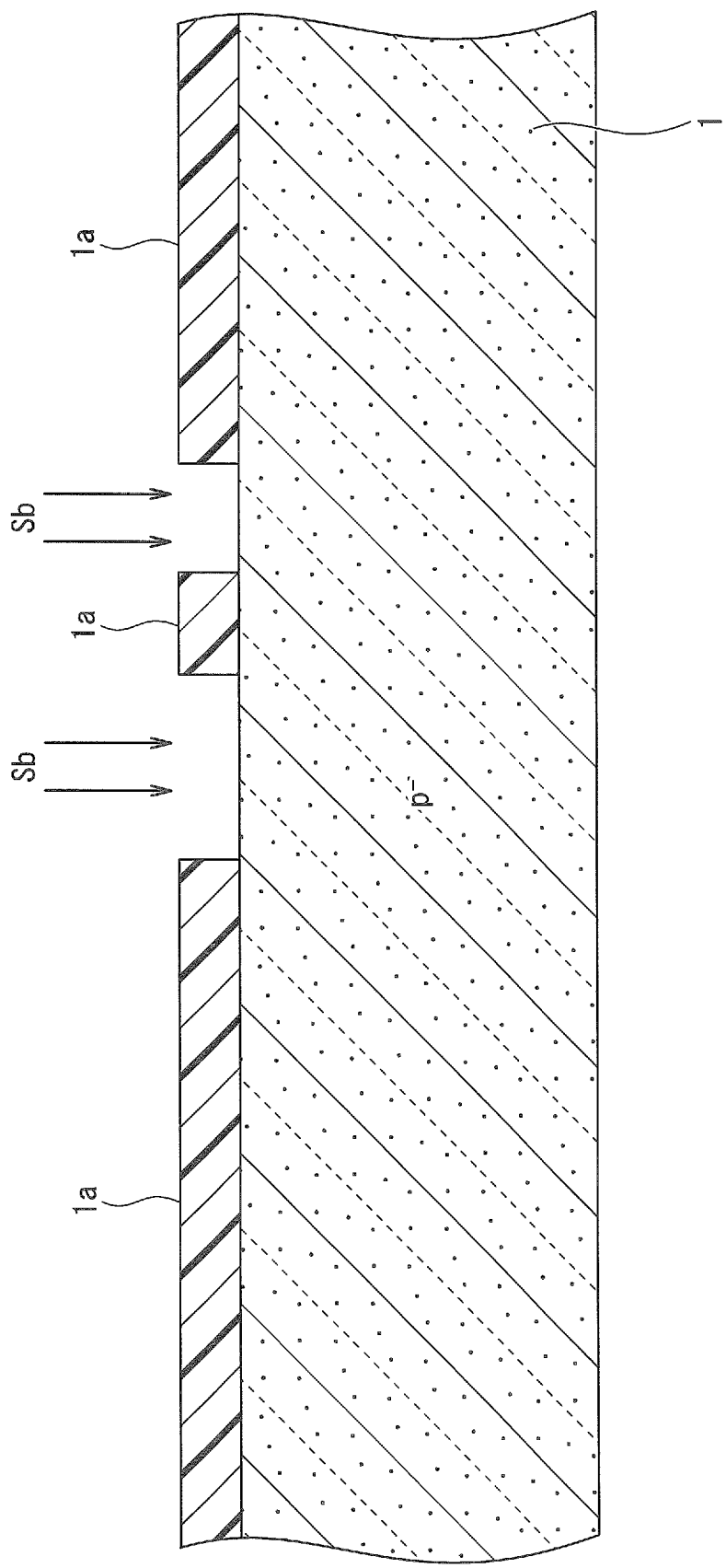
FIG. 8 is a cross-sectional view illustrating a process of manufacturing the semiconductor integrated circuit according to the embodiment of the present invention.

A method of manufacturing the semiconductor integrated circuit according to the embodiment of the present invention is illustrated below with reference to FIG. 8 to FIG. 11. First, the $p^-$-type semiconductor substrate 1 made from silicon is prepared. A photoresist film 1a is then coated on the top surface of the semiconductor substrate 1, and is delineated by photolithography, as illustrated in FIG. 8. Using the delineated photoresist film 1a as a mask for ion implantation, n-type impurity ions such as Sb, P, or As are locally implanted in the $p^-$-type semiconductor substrate 1. The photoresist film 1a is then removed.

Figure 9:
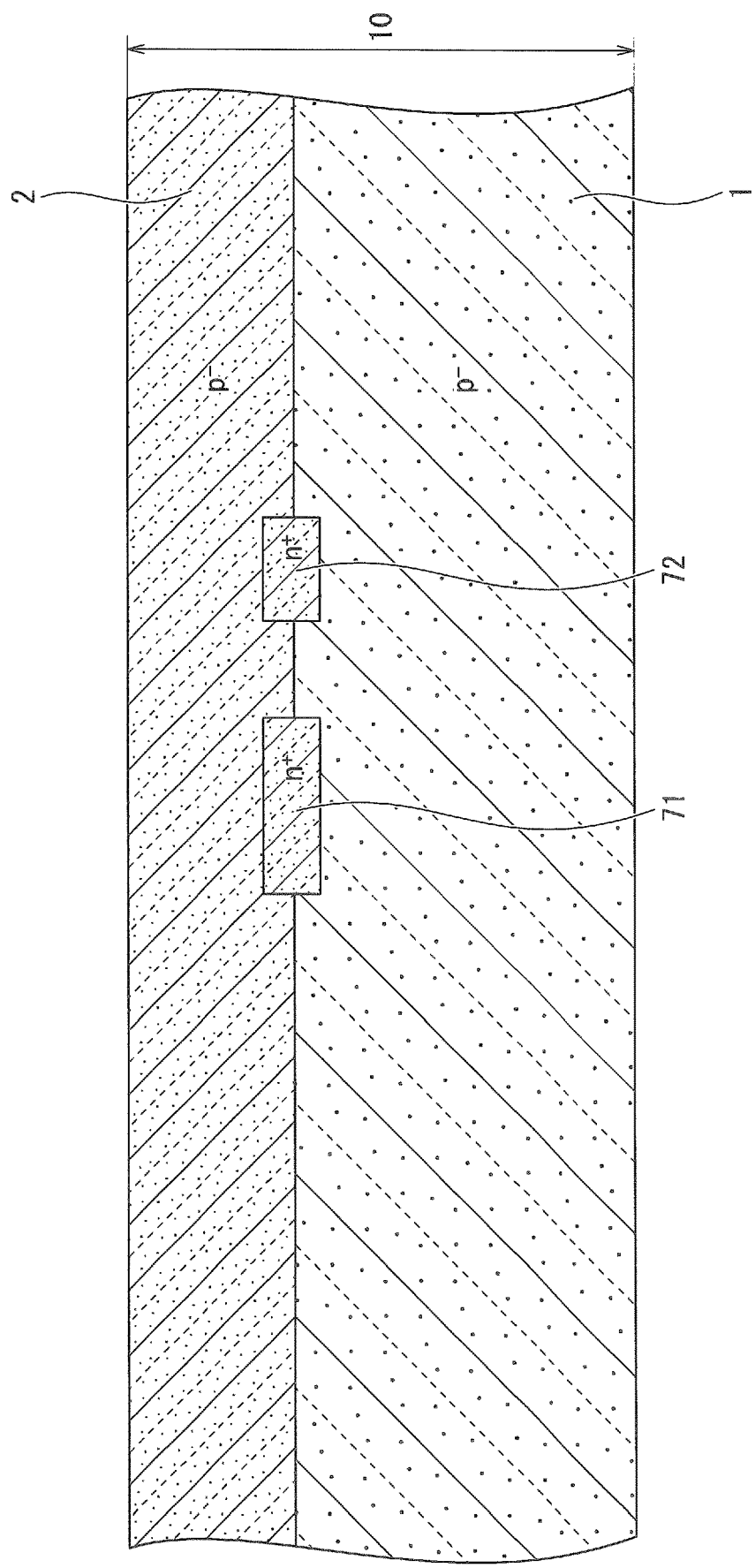
FIG. 9 is a cross-sectional view, continued from FIG. 8, illustrating the process of manufacturing the semiconductor integrated circuit according to the embodiment of the present invention.

Subsequently, the $p^-$-type epitaxial layer 2 is epitaxially grown on the top surface of the semiconductor substrate 1, as illustrated in FIG. 9. The heat generated upon the epitaxial growth activates and causes the n-type impurity ions implanted in the semiconductor substrate 1 to be n-type impurities. The n-type impurities are diffused in the semiconductor substrate 1 and further upwardly diffused in the epitaxial layer 2. The diffusion of the impurities provides the $n^+$-type buried layers 71 and 72 locally and limitedly at the interface between the semiconductor substrate 1 and the epitaxial layer 2. The $n^+$-type buried layers 73, 74, and 75 illustrated in FIG. 3 are also locally and limitedly provided simultaneously with the $n^+$-type buried layers 71 and 72.

Figure 10:
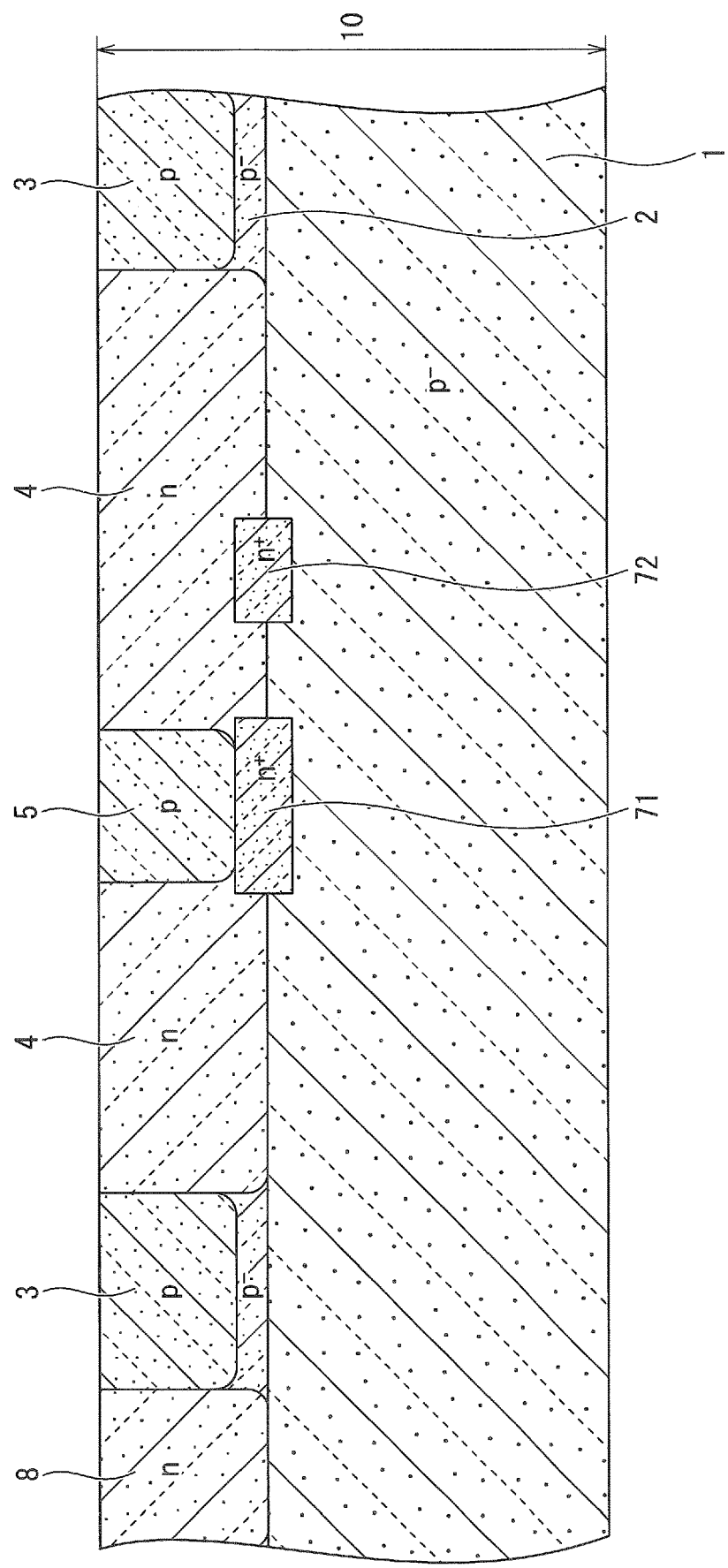
FIG. 10 is a cross-sectional view, continued from FIG. 9, illustrating the process of manufacturing the semiconductor integrated circuit according to the embodiment of the present invention.

Subsequently, the n-well region 4, the p-well region 5, p-type isolation region 3, and the n-well region 8 are deposited in the epitaxial layer 2 by photolithography, ion implantation, and annealing, for example, as illustrated in FIG. 10. The p-well regions 18 and 19 illustrated in FIG. 3 are also formed in this step. A thick oxide film serving as a field oxide film is then formed on the entire top surface of the epitaxial layer 2 by thermal oxidation, for example. At the same time, an isolation region is formed by LOCOS or STI, for example. In addition, channel-stop ion implantation may be carried out as necessary. A window on which an active region is exposed is formed partly in the field oxide film by photolithography or dry etching. The surface of the semiconductor region exposed to the window is then thermally oxidized so as to form a gate insulating film. A doped polysilicon film is further deposited on the top surface of the gate insulating film by a chemical vapor deposition (CVD) method, for example.

Figure 11:
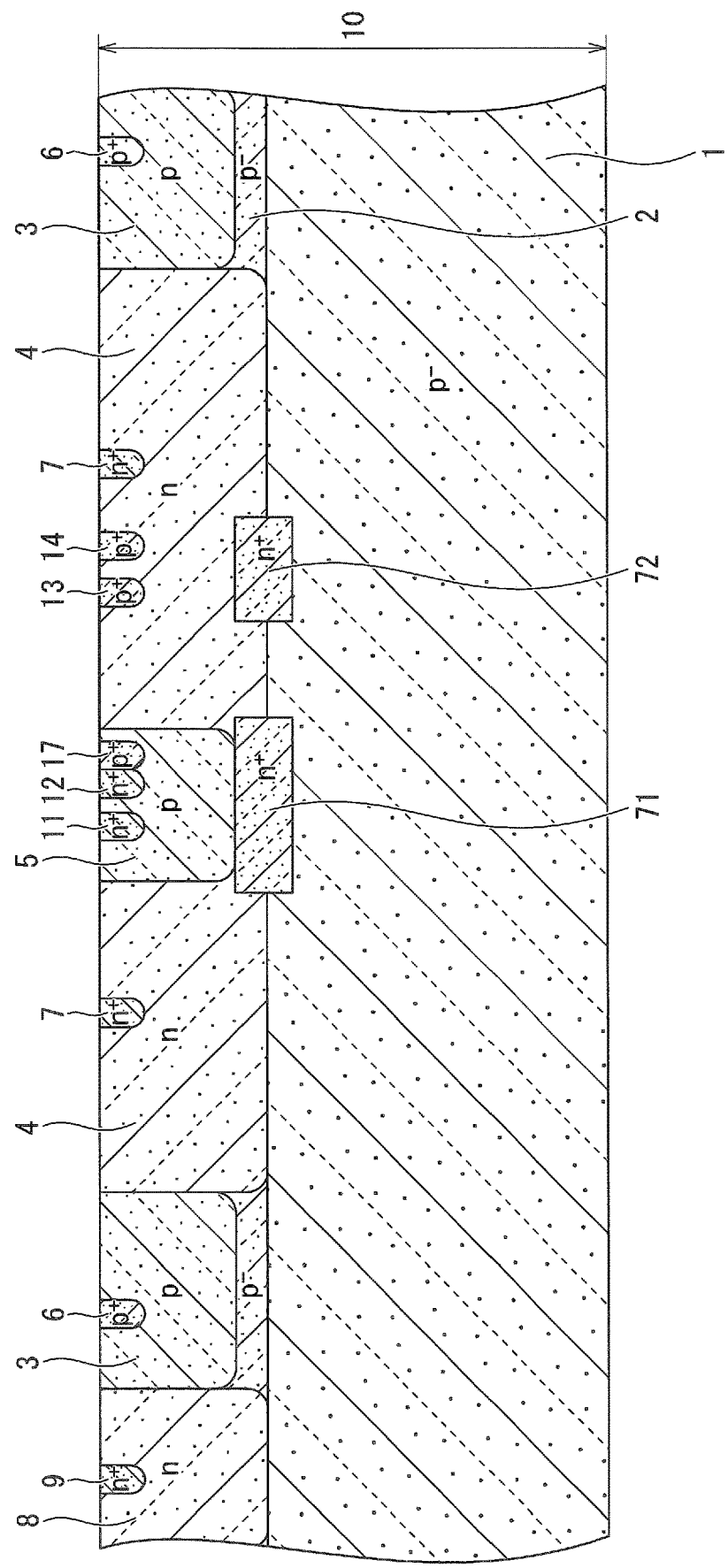
FIG. 11 is a cross-sectional view, continued from FIG. 10, illustrating the process of manufacturing the semiconductor integrated circuit according to the embodiment of the present invention.

Subsequently, the doped polysilicon film is delineated by photolithography or dry etching so as to form the gate electrodes 21, 22, and 23 illustrated in FIG. 3 and FIG. 4. The $n^+$-type contact region 9 is also formed simultaneously. The $n^+$-type source region 11 and the $n^+$-type drain region 12 of the nMOS transistor 91 are then formed in a self-aligned manner by use of the gate electrode 21 by photolithography, ion implantation, and annealing, for example, as illustrated in FIG. 11. The $p^+$-type source region 13 and the $p^+$-type drain region 14 of the pMOS transistor 92 are further formed in a self-aligned manner by use of the gate electrode 22. The $p^+$-type contact region 17 and the $p^+$-type contact region 6 are also formed simultaneously.

The passive elements 31 to 37 and the pads 81 to 83 illustrated in FIG. 3 and FIG. 4 are formed by photolithography, CVD, or dry etching simultaneously with or after the step of forming the nMOS transistor 91 and the pMOS transistor 92. The semiconductor integrated circuit 50 according to the embodiment of the present invention is thus completed.

First Modified Example

Figure 12:
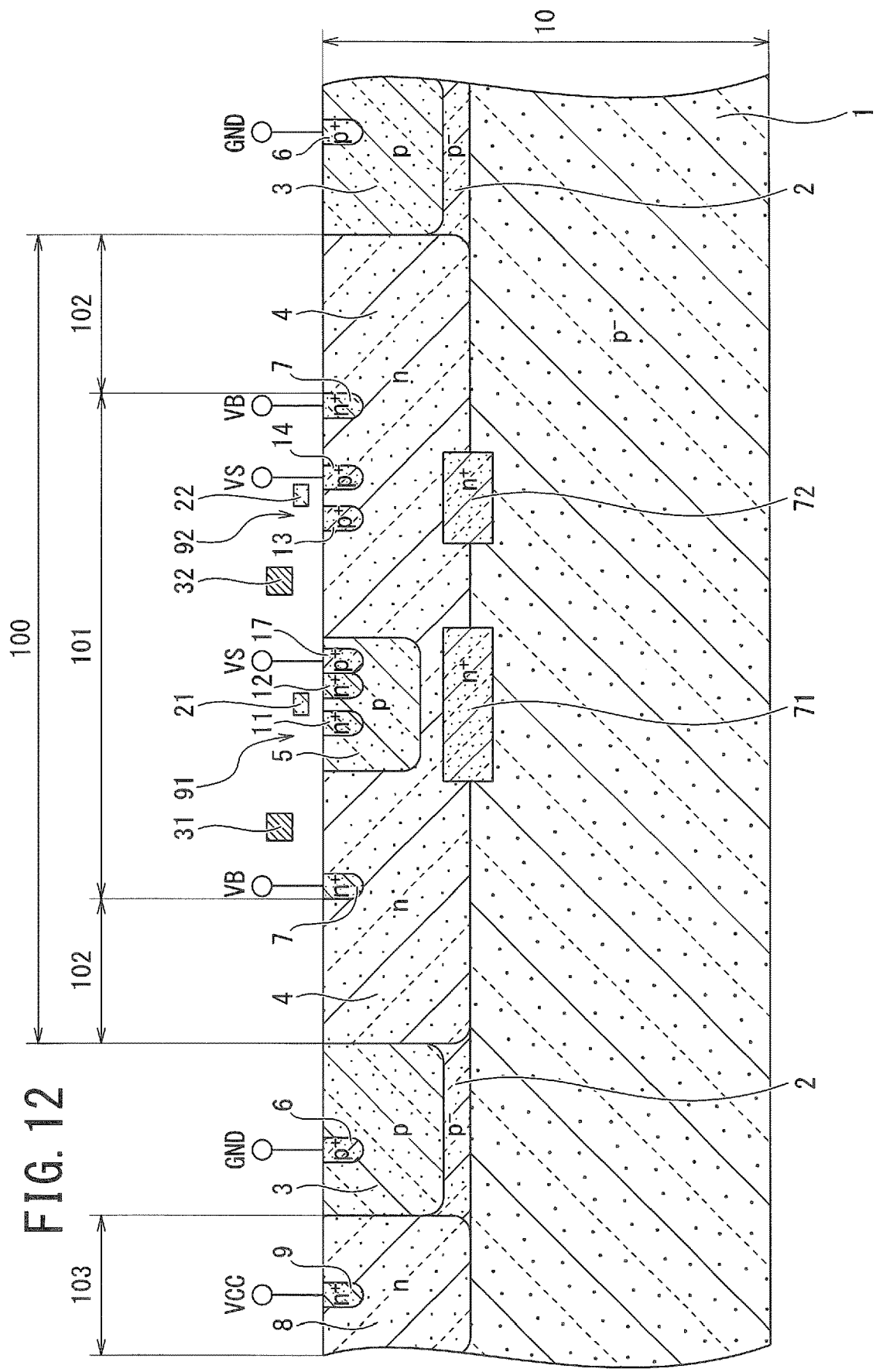
FIG. 12 is a cross-sectional view illustrating a semiconductor integrated circuit according to a first modified example of the embodiment of the present invention.

A semiconductor integrated circuit according to a first modified example of the embodiment of the present invention differs from the semiconductor integrated circuit 50 according to the embodiment of the present invention illustrated in FIG. 4 in that the p-well region 5 in the high side circuit region 101 is deposited shallowly, as illustrated in FIG. 12. The p-well region 5 is deposited separately from the $n^+$-type buried layer 71 buried under the p-well region 5. The other configuration of the semiconductor integrated circuit according to the first modified example of the embodiment of the present invention is the same as that of the semiconductor integrated circuit 50 according to the embodiment of the present invention illustrated in FIG. 4, and overlapping explanations are not repeated below.

The semiconductor integrated circuit according to the first modified example in which the p-well region 5 is deposited separately from the $n^+$-type buried layer 71, can achieve the effects similar to those in the embodiment of the present invention.

Second Modified Example

Figure 13:
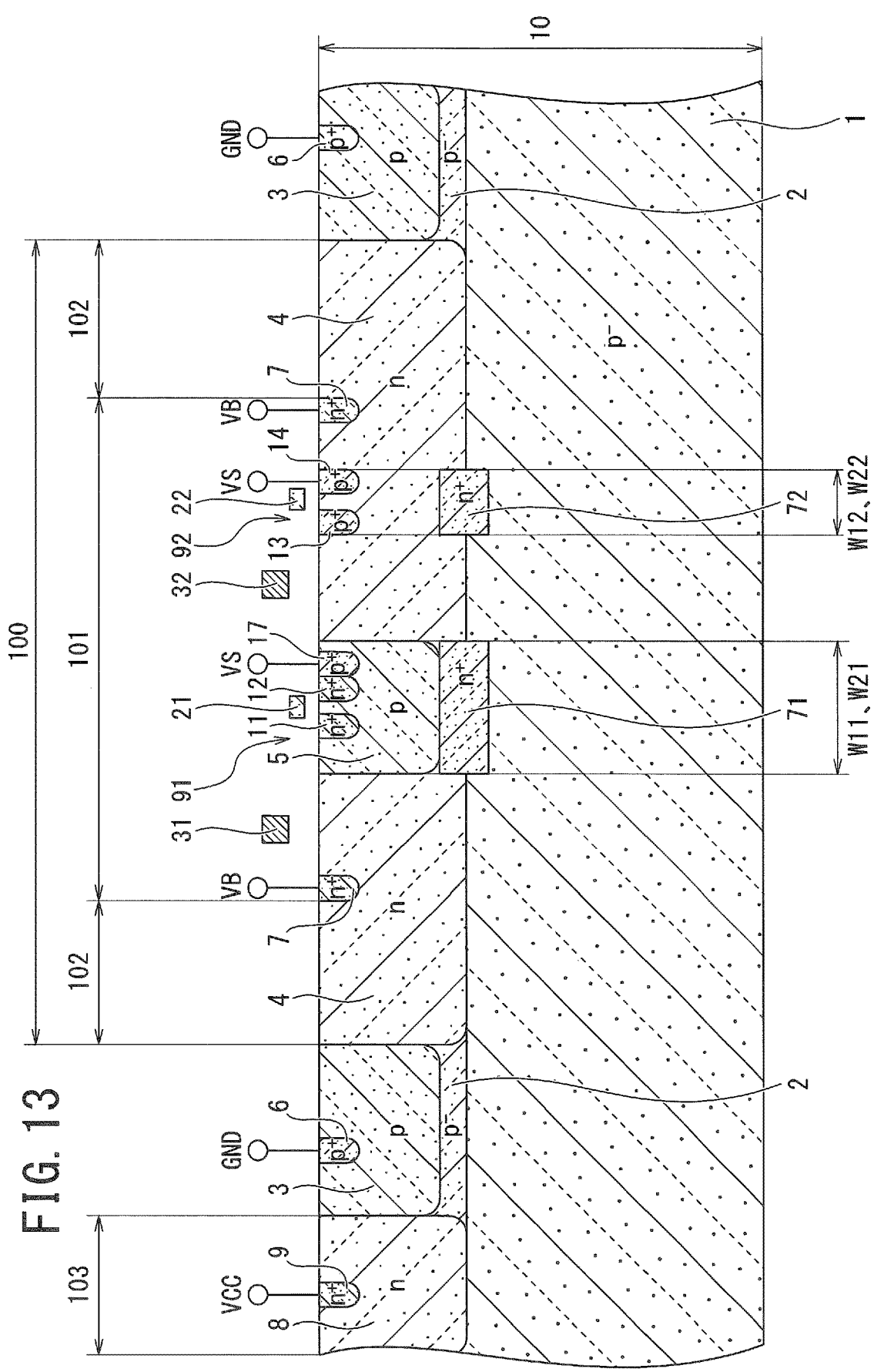
FIG. 13 is a cross-sectional view illustrating a semiconductor integrated circuit according to a second modified example of the embodiment of the present invention.

A semiconductor integrated circuit according to a second modified example of the embodiment of the present invention differs from the semiconductor integrated circuit 50 according to the embodiment of the present invention illustrated in FIG. 4 in that the width W11 of the $n^+$-type buried layer 71 and the width W12 of the $n^+$-type buried layer 72 in the high side circuit region 101 are set to be narrower, as illustrated in FIG. 13. The width W11 of the buried layer 71 conforms to the width W21 of the p-well region 5, The width W12 of the buried layer 72 conforms to the width W22 of the pMOS transistor 92. The other configuration of the semiconductor integrated circuit according to the second modified example of the embodiment of the present invention is the same as that of the semiconductor integrated circuit 50 according to the embodiment of the present invention illustrated in FIG. 4, and overlapping explanations are not repeated below.

The semiconductor integrated circuit according to the second modified example in which the width W11 of the buried layer 71 conforms to the width W21 of the p-well region 5, and the width W12 of the buried layer 72 conforms to the width W22 of the pMOS transistor 92, can achieve the effects similar to those in the embodiment of the present invention.

Third Modified Example

Figure 14:
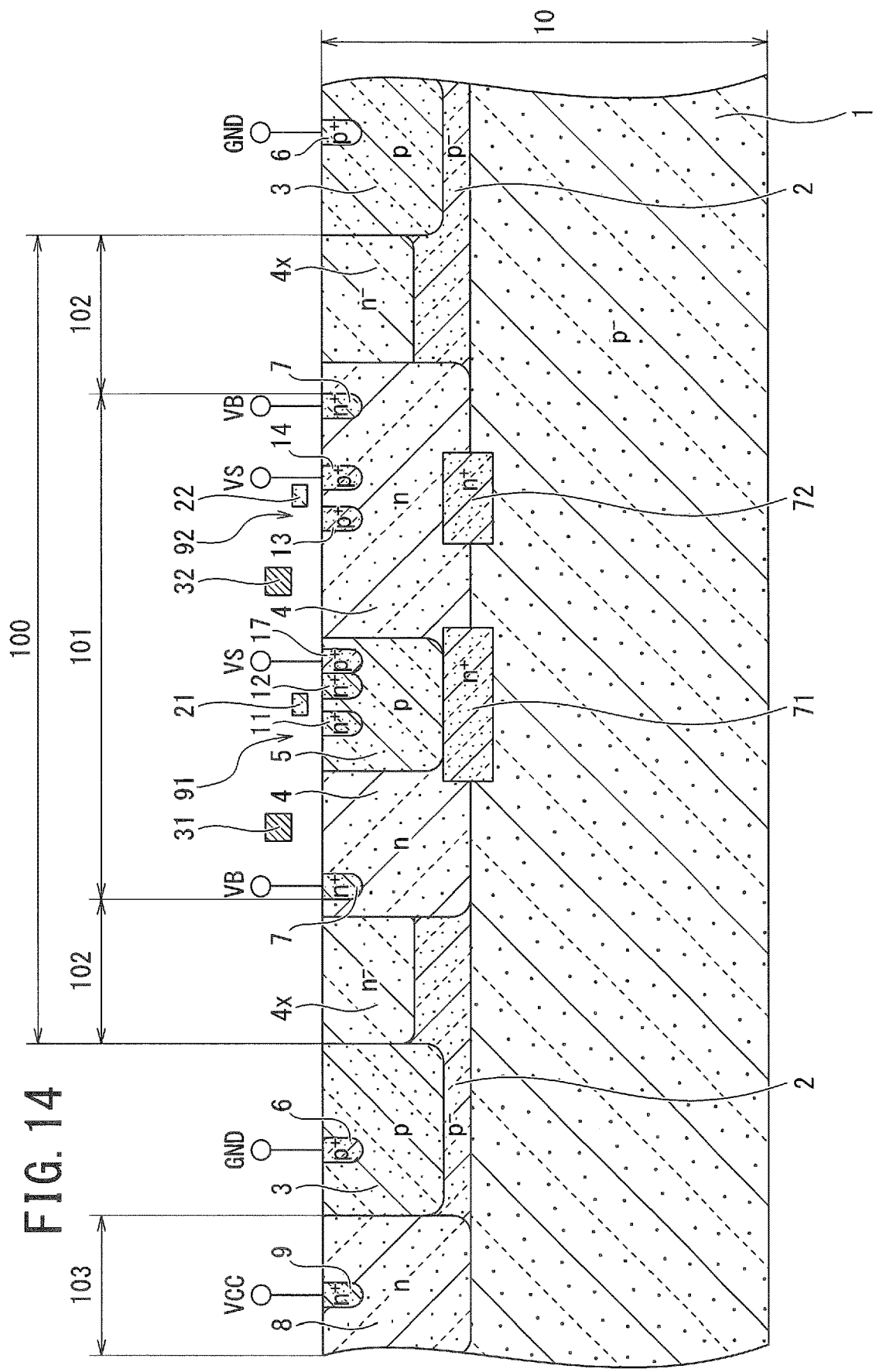
FIG. 14 is a cross-sectional view illustrating a semiconductor integrated circuit according to a third modified example of the embodiment of the present invention.

A semiconductor integrated circuit according to a third modified example of the embodiment of the present invention differs from the semiconductor integrated circuit 50 according to the embodiment of the present invention illustrated in FIG. 4 in that a breakdown voltage region 4x of n⁻-type is further deposited between the n-well region 4 and the p-type isolation region 3 in the high side circuit region 101, as illustrated in FIG. 14. The breakdown voltage region 4x has a loop shape in a planar pattern to surround the n-well region 4. The breakdown voltage region 4x is deposited more shallowly than the n-well region 4. The breakdown voltage region 4x has a lower impurity concentration than the n-well region 4. The other configuration of the semiconductor integrated circuit according to the third modified example of the embodiment of the present invention is the same as that of the semiconductor integrated circuit 50 according to the embodiment of the present invention illustrated in FIG. 4, and overlapping explanations are not repeated below.

The semiconductor integrated circuit according to the third modified example in which the n⁻-type breakdown voltage region 4x is deposited between the n-well region 4 and the p-type isolation region 3 in the high side circuit region 101, can achieve the effects similar to those in the embodiment of the present invention.

Fourth Modified Example

Figure 15:
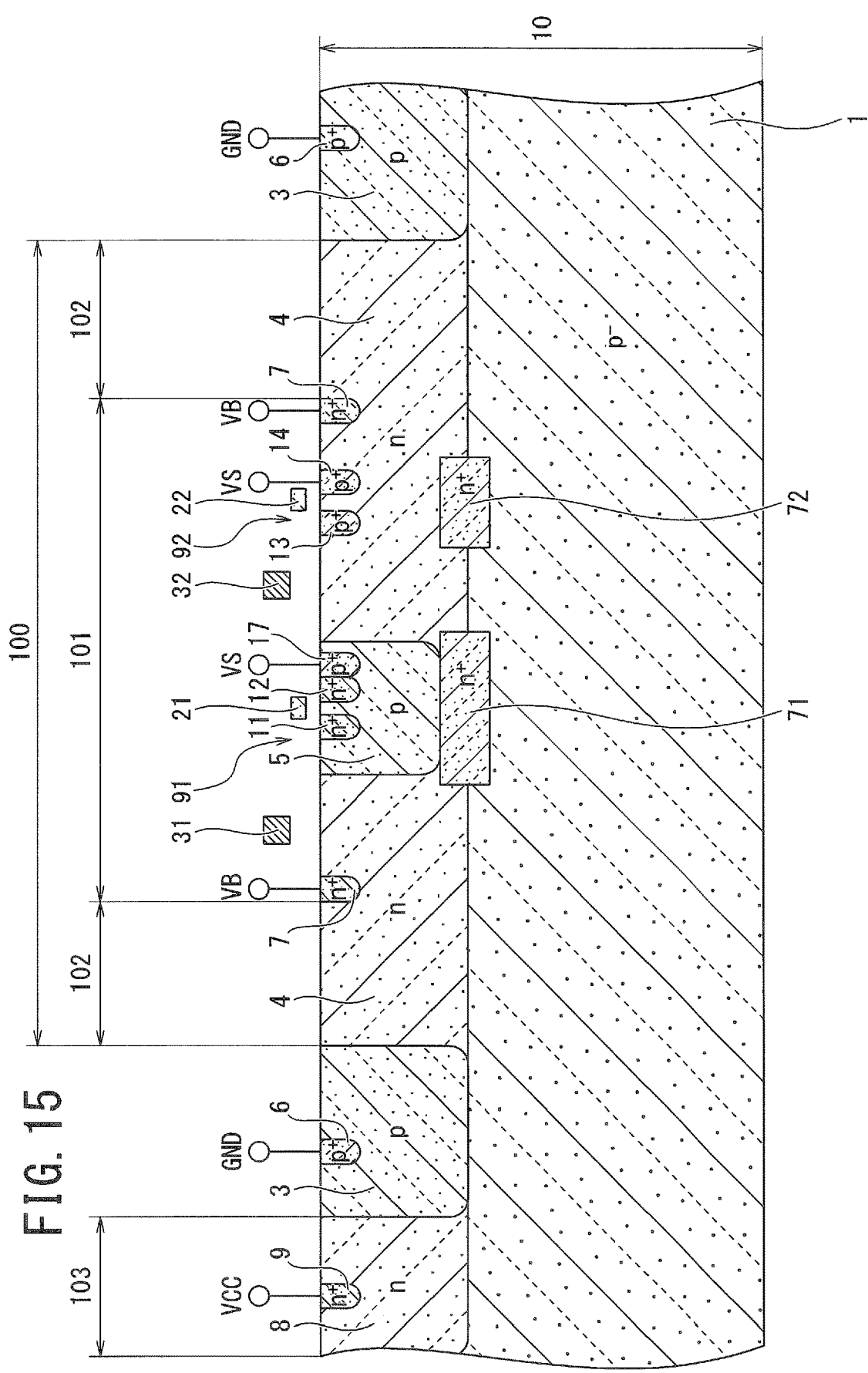
FIG. 15 is a cross-sectional view illustrating a semiconductor integrated circuit according to a fourth modified example of the embodiment of the present invention.

A semiconductor integrated circuit according to a fourth modified example of the embodiment of the present invention differs from the semiconductor integrated circuit 50 according to the embodiment of the present invention illustrated in FIG. 4 in that the n-well region 4 in the high side circuit region 101 is a part of an n-type epitaxial layer, as illustrated in FIG. 15.

According to the fourth modified example of the embodiment of the present invention, the n-type epitaxial layer is grown on the p⁻-type semiconductor substrate 1, instead of the p⁻-type epitaxial layer, so as to implement the semiconductor base body 10 by the p⁻-type semiconductor substrate 1 and the n-type epitaxial layer. A part of the n-type epitaxial layer defined by the p-well region 5 and the p-type isolation region 3 deposited in the n-type epitaxial layer, serves as the n-well region 4. The other configuration of the semiconductor integrated circuit according to the fourth modified example of the embodiment of the present invention is the same as that of the semiconductor integrated circuit 50 according to the embodiment of the present invention illustrated in FIG. 4, and overlapping explanations are not repeated below.

The semiconductor integrated circuit according to the fourth modified example in which the n-well region 4 is not the diffusion layer provided in the p-type epitaxial layer but is a part of the n-type epitaxial layer, can achieve the effects similar to those in the embodiment of the present invention.

Fifth Modified Example

Figure 16:
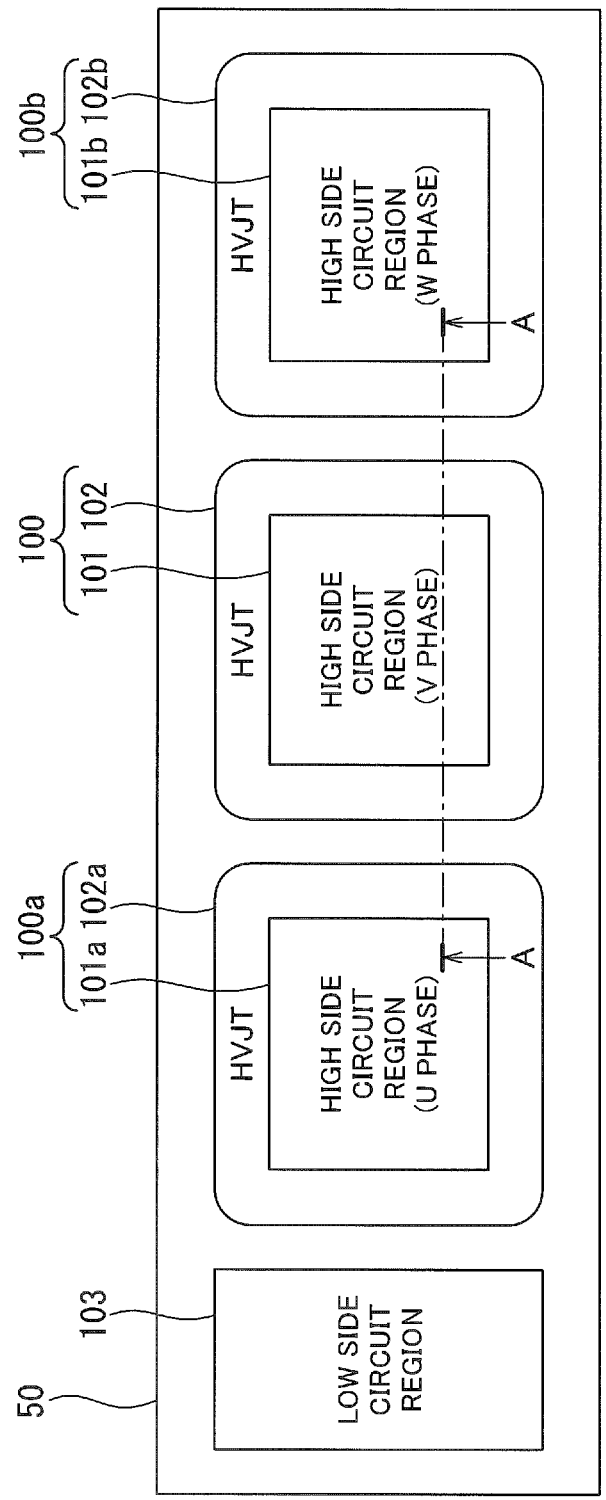
FIG. 16 is a plan view illustrating a semiconductor integrated circuit according to a fifth modified example of the embodiment of the present invention.

A semiconductor integrated circuit according to a fifth modified example of the embodiment of the present invention differs from the semiconductor integrated circuit 50 according to the embodiment of the present invention illustrated in FIG. 4 in including high side circuit portions 100a, 100, and 100b of U, V, and W phases implementing a three-phase inverter, as illustrated in FIG. 16.

In the semiconductor integrated circuit according to the fifth modified example of the embodiment of the present invention, the high side circuit portions 100a, 100, and 100b of the U, V, and W phases have the same configuration and are arranged adjacent to each other. The high side circuit portion 100a of the U phase includes a high side circuit region 101a, and a HVJT 102a arranged at a circumference of the high side circuit region 101a. The high side circuit portion 100 of the V phase is the same as the high side circuit portion 100 illustrated in FIG. 2, and includes the high side circuit region 101, and the HVJT 102 arranged at the circumference of the high side circuit region 101. The high side circuit portion 100b of the W phase includes a high side circuit region 101b, and a HVJT 102b arranged at a circumference of the high side circuit region 101b.

Figure 17:
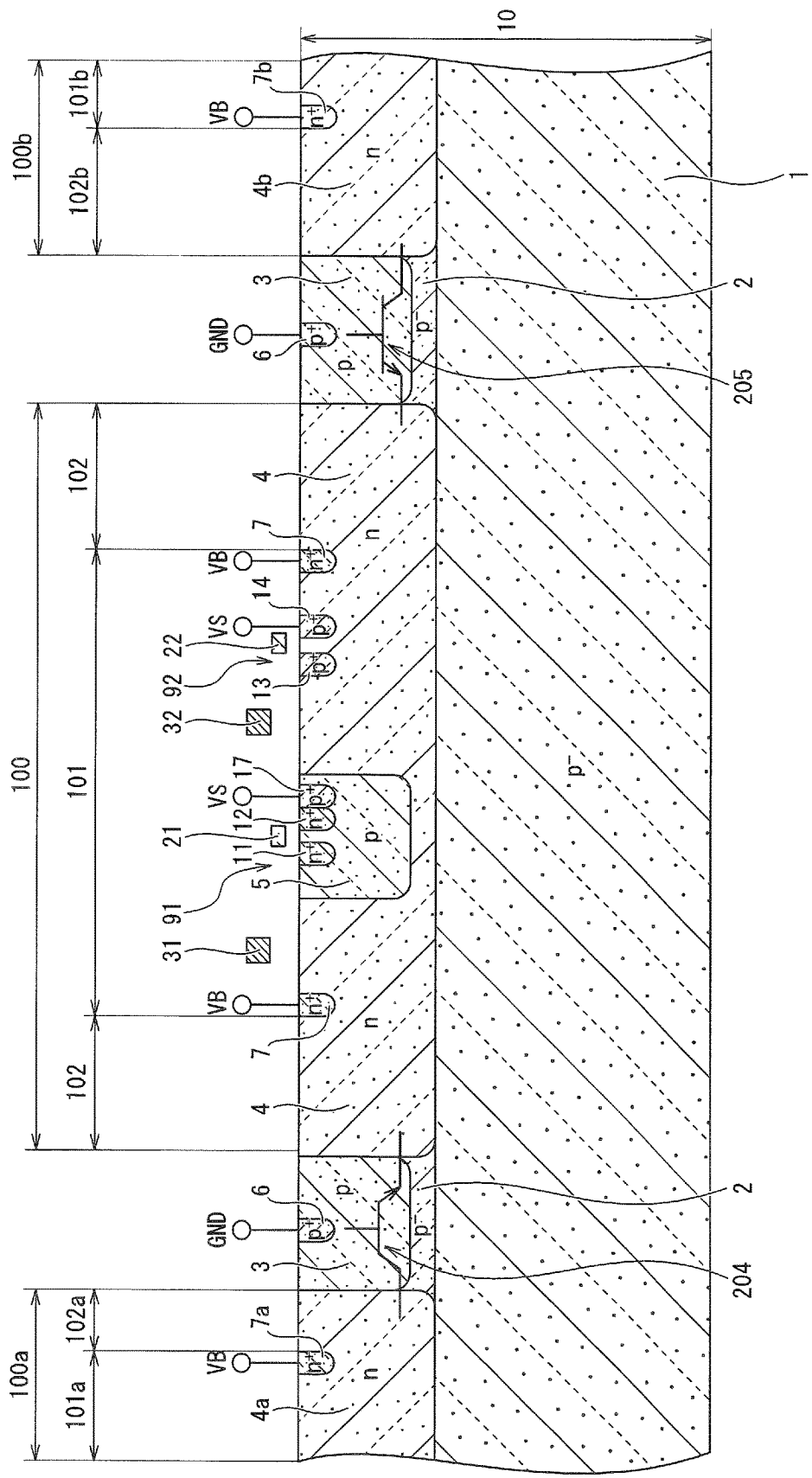
FIG. 17 is a cross-sectional view of the semiconductor integrated circuit as viewed from direction A-A in FIG. 16.

FIG. 17 is a cross-sectional view of the semiconductor integrated circuit as viewed from direction A-A in FIG. 16. As illustrate in FIG. 17, an n-well region 4a in the high side circuit region 101a of the U phase, the p-type isolation region 3, and the n-well region 4 in the high side circuit region 101 of the V phase form a lateral parasitic npn bipolar transistor 204. In addition, the n-well region 4 in the high side circuit region 101 of the V phase, the p-type isolation region 3, and an n-well region 4b in the high side circuit region 101b of the W phase form a lateral parasitic npn bipolar transistor 205.

The other configuration of the semiconductor integrated circuit according to the fifth modified example of the embodiment of the present invention is the same as that of the semiconductor integrated circuit 50 according to the embodiment of the present invention illustrated in FIG. 4, and overlapping explanations are not repeated below.

The semiconductor integrated circuit according to the fifth modified example in which the plural high side circuit portions 100a, 100, and 100b are arranged adjacent to each other, can achieve the effects similar to those in the embodiment of the present invention in the respective high side circuit portions 100a, 100, and 100b.

If the VB potential in the high side circuit region 101a of the U phase is increased to a high potential of about 600 voltages, and the VB potential in the high side circuit region 101 of the V phase is led to a negative voltage lower than the VS potential, the parasitic npn bipolar transistor 204 may activate to cause damage to the HVIC. Similarly, if the VB potential in the high side circuit region 101b of the W phase is increased to a high potential of about 600 voltages, and the VB potential in the high side circuit region 101 of the V phase is led to a negative voltage lower than the VS potential, the parasitic npn bipolar transistor 205 may activate to cause damage to the HVIC.

If the n⁺-type buried layer is buried evenly in all of the high side circuit regions 101a, 101, and 101b, as in the case of the semiconductor integrated circuit of the second comparative example illustrated in FIG. 6 and FIG. 7, the resistance on the emitter side and the collector side of the respective parasitic npn bipolar transistors 204 and 205 is decreased, which increases the efficiency of flow of current. Some measures may be taken to deal with the activation of the lateral parasitic npn bipolar transistors 204 and 205, such as an increase in distance of the respective isolation regions between the respective high side circuit regions 101a, 101, and 101b, interposition of dielectric isolation layers between the respective high side circuit regions 101a, 101, and 101b, and interposition of p-type buried layers, as in the case of the semiconductor integrated circuit of the second comparative example, but all of these measures increase the manufacturing costs.

In the semiconductor integrated circuit according to the fifth modified example of the embodiment of the present invention, the n$^+$-type buried layers 71 and 72 are buried locally and limitedly in the high side circuit region 101. Similarly, although not shown, the n$^+$-type buried layers are buried locally and limitedly in the respective high side circuit regions 101a and 101b. The semiconductor integrated circuit according to the fifth modified example of the embodiment of the present invention thus can increase the resistance on the emitter side and the collector side of the respective parasitic npn bipolar transistors 204 and 205, as compared with the semiconductor integrated circuit of the second comparative example as illustrated in FIG. 6 and FIG. 7 in which the n$^+$-type buried layer 70 is buried evenly and entirely in the high side circuit region 101, so as to decrease the efficiency of flow of current, avoiding the activation of the parasitic npn bipolar transistors 204 and 205 accordingly. The semiconductor integrated circuit according to the fifth modified example thus can enhance the noise tolerance between the respective high side circuit regions 101a, 101, and 101b at low cost without an increase in chip area.

Other Embodiments

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

The embodiment of the present invention illustrated above is not limited to the case of the semiconductor integrated circuit using the Si wafer as the semiconductor base body 10. The technical idea described in the embodiment of the present invention may be applied to a semiconductor integrated circuit using a semiconductor of a compound such as arsenic gallium (GaAs). The technical idea described in the embodiment of the present invention may also be applied to a semiconductor integrated circuit using a wide-bandgap semiconductor such as SiC, gallium nitride (GaN), or diamond. The technical idea described in the embodiment of the present invention may also be applied to a semiconductor integrated circuit using a narrow-bandgap semiconductor such as indium antimonide (InSb) or semimetal.

What is claimed is:
1. A semiconductor integrated circuit, comprising:
a semiconductor base body of a first conductivity type;
a first well region of a second conductivity type, deposited at an upper portion of the semiconductor base body, to which a first potential is applied;
a second well region of the first conductivity type, deposited at an upper portion of the first well region, to which a second potential lower than the first potential is applied;
a main electrode region to which the second potential is applied, the main electrode region being deposited at the upper portion of the first well region and away from the second well region;
a first buried layer of the second conductivity type buried locally under the second well region and in direct physical contact with the second well region; and
a second buried layer of the second conductivity type buried locally under the main electrode region and away from the first buried layer.

2. The semiconductor integrated circuit of claim 1, wherein a width of the first buried layer is greater than or equal to a width of the second well region.

3. The semiconductor integrated circuit of claim 1, wherein:
the semiconductor base body includes a semiconductor substrate of the first conductivity type, and an epitaxial layer of the first conductivity type deposited on the semiconductor substrate; and
the first well region is a diffusion layer provided in the epitaxial layer.

4. The semiconductor integrated circuit of claim 1, wherein:
the semiconductor base body includes a semiconductor substrate of the first conductivity type, and an epitaxial layer of the second conductivity type deposited on the semiconductor substrate; and
the first well region is part of the epitaxial layer.

5. The semiconductor integrated circuit of claim 1, wherein the main electrode region is deposited more shallowly than the second well region.

6. The semiconductor integrated circuit of claim 1, further comprising:
an isolation region of the first conductivity type to which a third potential lower than the first and second potentials is applied, the isolation region being deposited at an upper portion of the semiconductor base body in contact with the first well region; and
a third well region of the second conductivity type to which a fourth potential different from the first to third potentials is applied, the third well region being deposited at an upper portion of the semiconductor base body in contact with the isolation region.

7. The semiconductor integrated circuit of claim 1, further comprising:
an isolation region of the first conductivity type to which a third potential lower than the first and second potentials is applied, the isolation region being deposited at an upper portion of the semiconductor base body in contact with the first well region; and
a third well region of the second conductivity type to which the first potential is applied, the third well region being deposited at an upper portion of the semiconductor base body in contact with the isolation region.

8. A semiconductor integrated circuit, comprising:
a semiconductor base body of a first conductivity type;
a first well region of a second conductivity type, deposited at an upper portion of the semiconductor base body;
a second well region of the first conductivity type, deposited at an upper portion of the first well region, the first well region being in contact with the second well region;

a main electrode region of the first conductivity type, to which a same potential as a potential applied to the second well region is applied, and deposited at the upper portion of the first well region and spaced apart from the second well region, the main electrode region being in contact with the first well region;

a first buried layer of the second conductivity type buried locally under the second well region; and a second buried layer of the second conductivity type buried locally under the main electrode region and away from the first buried layer.

9. The semiconductor integrated circuit of claim 8, wherein the second well region is in contact with the first buried layer.

10. The semiconductor integrated circuit of claim 8, wherein the second well region is separated from the first buried layer.

11. The semiconductor integrated circuit of claim 8, wherein a width of the first buried layer is greater than or equal to a width of the second well region.

12. The semiconductor integrated circuit of claim 8, wherein:

the semiconductor base body includes a semiconductor substrate of the first conductivity type, and an epitaxial layer of the first conductivity type deposited on the semiconductor substrate, and the first well region is a diffusion layer provided in the epitaxial layer.

13. The semiconductor integrated circuit of claim 8, wherein:

the semiconductor base body includes a semiconductor substrate of the first conductivity type, and an epitaxial layer of the second conductivity type deposited on the semiconductor substrate; and the first well region is part of the epitaxial layer.

14. The semiconductor integrated circuit of claim 8, wherein the main electrode region is deposited more shallowly than the second well region.

15. The semiconductor integrated circuit of claim 8, further comprising:

an isolation region of the first conductivity type, the isolation region being deposited at an upper portion of the semiconductor base body in contact with the first well region; and a third well region of the second conductivity type, the third well region being deposited at an upper portion of the semiconductor base body in contact with the isolation region.

16. The semiconductor integrated circuit of claim 8, wherein a bottom of the main electrode region is in contact with the first well region.

17. The semiconductor integrated circuit of claim 8, wherein a first potential is applied to the first well region, a second potential lower than the first potential is applied to the second well region, and the second potential is applied to the main electrode region.

18. The semiconductor integrated circuit of claim 15, wherein a first potential is applied to the first well region, a second potential lower than the first potential is applied to the second well region, the second potential is applied to the main electrode region, and a third potential lower than the first and second potentials is applied to the isolation region.

19. The semiconductor integrated circuit of claim 18, wherein the first potential is applied to the third well region or a fourth potential different from the first to third potentials is applied to the third well region.

20. A semiconductor integrated circuit, comprising:

a semiconductor base body of a first conductivity type;

a first well region of a second conductivity type, deposited at an upper portion of the semiconductor base body;

a second well region of the first conductivity type, deposited at an upper portion of the first well region, the first well region being in contact with the second well region;

a main electrode region of the first conductivity type deposited at the upper portion of the first well region and spaced apart from the second well region, the main electrode region being in contact with the first well region;

a first buried layer of the second conductivity type buried locally under the second well region;

a second buried layer of the second conductivity type buried locally under the main electrode region and away from the first buried layer; and contact regions of the second conductivity type, each selectively deposited at the upper portion of the first well region and spaced apart from the second well region in a width direction, the contact regions being in contact with the first well region, wherein a width of the first buried layer is greater than a width of the second buried layer, and the first buried layer and second buried layer are not buried locally under the contact regions.

* * * * *